(12) United States Patent
Drummond et al.

(10) Patent No.: US 12,266,936 B2
(45) Date of Patent: Apr. 1, 2025

(54) SUBSPACE-BASED APPROACH TO SYNCHROPHASOR ESTIMATION

(71) Applicants: Arizona Board of Regents on behalf of Arizona State University, Scottsdale, AZ (US); The United States of America as Represented by the Secretary of the Army, Washington, DC (US)

(72) Inventors: Zachary Drummond, Mesa, AZ (US); Kevin Claytor, Columbia, MD (US)

(73) Assignees: Arizona Board of Regents on behalf of Arizona State University, Scottsdale, AZ (US); The United States of America as Represented by the Secretary of the Army, Washington, DC (US)

( * ) Notice: Subject to any disclaimer, the term of this patent is extended or adjusted under 35 U.S.C. 154(b) by 558 days.

(21) Appl. No.: 17/561,062

(22) Filed: Dec. 23, 2021

(65) Prior Publication Data

US 2022/0285944 A1 Sep. 8, 2022

Related U.S. Application Data

(60) Provisional application No. 63/129,970, filed on Dec. 23, 2020.

(51) Int. Cl.
*H02J 3/24* (2006.01)
(52) U.S. Cl.
CPC .................................. *H02J 3/242* (2020.01)
(58) Field of Classification Search
None
See application file for complete search history.

(56) References Cited

U.S. PATENT DOCUMENTS

| 10,775,420 B2 | 9/2020 | Heintzelman et al. |
| 10,942,204 B1 * | 3/2021 | Liu ...................... G01R 25/005 |
| 2013/0173189 A1 * | 7/2013 | Zhang ..................... G06F 17/10 |
| | | 702/60 |

OTHER PUBLICATIONS

Hai, Ying, and Jing-yu Chen. "Exact model order ESPRIT technique for frequency and power estimation." 2012 IEEE 14th International Conference on Communication Technology. IEEE, 2012. (Year: 2012).*

(Continued)

*Primary Examiner* — Raymond L Nimox
(74) *Attorney, Agent, or Firm* — Withrow & Terranova, P.L.L.C.

(57) ABSTRACT

A subspace-based approach to synchrophasor estimation is provided. Embodiments described herein provide two improvements to subspace-based phasor measurement unit (PMU) algorithms based on estimation of signal parameters via rotational invariance techniques (ESPRIT) frequency estimation. The first is a dynamic, real-time thresholding method to determine the size of the signal subspace. This allows for accurate ESPRIT-based frequency estimates of the nominal system frequency as well as the frequencies of any out-of-band interference or harmonic frequencies. Since other frequencies are included in the least squares (LS) estimate, the interference from frequencies other than nominal can be excluded. This results in a near flat estimation error over changes in a) nominal system frequency, b) harmonic distortion, and c) out-of-band interference. Second, the computational burden of ESPRIT is reduced and the proposed algorithm runs in real time on resource-constrained platforms.

18 Claims, 16 Drawing Sheets

(56) References Cited

OTHER PUBLICATIONS

Macii, David, Grazia Barchi, and Daniele Fontanelli. "Decorrelation-based harmonic distortion reduction for synchrophasor measurements." 2017 IEEE International Workshop on Applied Measurements for Power Systems (AMPS). IEEE, 2017. (Year: 2017).*

Agrez, D., "Weighted Multi-Point Interpolated DFT to Improve Amplitude Estimation of Multi-Frequency Signal," IEEE Transactions on Instrumentation and Measurement, vol. 51, Issue 2, Apr. 2002, IEEE, pp. 287-292.

Banerjee, P. et al., "An Effective Dynamic Current Phasor Estimator for Synchrophasor Measurements," IEEE Transactions on Instrumentation and Measurement, vol. 64, No. 3, Sep. 2014, IEEE, 13 pages.

Banerjee, P. et al., "A Subspace-Based Dynamic Phasor Estimator for Synchrophasor Application," IEEE Transactions on Instrumentation and Measurement, vol. 61, No. 9, Apr. 2012, IEEE, pp. 2436-2445.

Belega, D. et al., "Accuracy Analysis of the Multicycle Synchrophasor Estimator Provided by the Interpolated DFT Algorithm," IEEE Transactions on Instrumentation and Measurement, vol. 62, No. 5, May 2013, IEEE, pp. 942-953.

Belega, D. et al., "An Effective Procedure for the Estimation of Harmonic Parameters of Distorted Sine-Waves," 2012 IEEE International Instrumentation and Measurement Technology Conference Proceedings, May 13-16, 2012, Graz, Austria, IEEE, 6 pages.

Belega, D. et al., "Dynamic Phasor and Frequency Measurements by an Improved Taylor Weighted Least Squares Algorithm," IEEE Transactions on Instrumentation and Measurement, vol. 64, No. 8, Aug. 2015, pp. 2165-2178.

Belega, D. et al., "Fast Taylor Weighted Least Squares Algorithm for Synchrophasor Estimation," 2019 IEEE 5th International forum on Research and Technology for Society and Industry (RTSI), Sep. 9-12, 2019, Florence, Italy, IEEE, 5 pages.

Bose, A., "Smart Transmission Grid Applications and Their Supporting Infrastructure," IEEE Transactions on Smart Grid, vol. 1, No. 1, Jun. 2010, IEEE, pp. 11-19.

Castello, P. et al., "Adaptive Taylor-Fourier synchrophasor estimation for fast response to changing conditions," 2012 IEEE International Instrumentation and Measurement Technology Conference Proceedings, May 13-16, 2012, Graz, Austria, IEEE, 6 pages.

Castello, P. et al., "A Fast and Accurate PMU Algorithm for P+M Class Measurement of Synchrophasor and Frequency," IEEE Transactions on Instrumentation and Measurement, vol. 63, No. 12, Dec. 2014, IEEE, pp. 2837-2845.

Cintuglu, M.H. et al., "Microgid Automation Assisted by Synchrophasors," 2015 IEEE Power & Energy Society Innovative Smart Grid Technologies Conference (ISGT), Feb. 18-20, 2015, Washington, DC, USA, IEEE, 5 pages.

De La O Serna, J.A., "Dynamic Phasor Estimates for Power System Oscillations," IEEE Transactions on Instrumentation and Measurement, vol. 56, No. 5, Oct. 2007, first published Sep. 2007, IEEE, pp. 1648-1657.

De La O Serna, J.A. et al., "Smart Grids Part 2: Synchrophasor Measurement Challenges," IEEE Instrumentation & Measurement Magazine, vol. 18, Issue 1, Feb. 2015, first published Jan. 2015, IEEE, pp. 13-16.

De La O Serna, J.A., "Synchrophasor Measurement with Polynomial Phase-Locked-Loop Taylor-Fourier Filters," IEEE Transactions on Instrumentation and Measurement, vol. 64, No. 2, Feb. 2015, first published Aug. 2014, IEEE, pp. 328-337.

Derviskadic, A. et al., "Iterative-Interpolated DFT for Synchrophasor Estimation: A Single Algorithm for P- and Mclass Compliant PMUs," IEEE Transactions on Instrumentation and Measurement, vol. 67, No. 3, Mar. 2018, pp. 547-558.

Dhillon, I.S., "A New O(n2) Algorithm for the Symmetric Tridiagonal Eigenvalue/Eigenvector Problem," A dissertation submitted in partial satisfaction of the requirements for the degree of Doctor of Philosophy in Computer Science, University of California, Berkeley, 1997, 195 pages.

Drummond, Z.D. et al., "An Optimized Subspace-Based Approach to Synchrophasor Estimation," IEEE Transactions on Instrumentation and Measurement, vol. 70, Aug. 2020, IEEE, 13 pages.

Eriksson, A. et al., "Second-order properties of MUSIC and ESPRIT estimates of sinusoidal frequencies in high SNR scenarios," IEE Proceedings F (Radar and Signal Processing), vol. 140, No. 4, Aug. 1993, pp. 266-272.

Frigo, G. et al., "Reduced Leakage Synchrophasor Estimation: Hilbert Transform Plus Interpolated DFT," IEEE Transactions on Instrumentation and Measurement, vol. 68, No. 10, Oct. 2019, first published Nov. 2018, IEEE, pp. 3468-3483.

Hunter, J.D., "Matplotlib: A 2D Graphics Environment," Computing in Science & Engineering, vol. 9, Issue 3, May-Jun. 2007, IEEE, pp. 90-95.

IEEE Power & Energy Society, "IEEE Standard for Synchrophasor Measurements for Power Systems," IEEE Std C37.118.1™—2011, Dec. 28, 2011, The Institute of Electrical and Electronics Engineers, Inc., 61 pages.

IEEE Power & Energy Society, "IEEE Standard for Synchrophasor Measurements for Power Systems—Amendment 1: Modification of Selected Performance Requirements," IEEE Std. C37.118.1a-2014, Apr. 30, 2014, The Institute of Electrical and Electronics Engineers, Inc., 25 pages.

IEEE Power and Energy Society, "IEEE/IEC International Standard—Measuring relays and protection equipment—Part 118-1: Synchrophasor for power systems—Measurements," IEEE/IEC Std. 60255-118-1-2018, Dec. 19, 2018, The Institute of Electrical and Electronics Engineers, Inc., 78 pages.

Jain, S. et al., "A Fast Harmonic Phasor Measurement Method for Smart Grid Applications," IEEE Transactions on Smart Grid, vol. 8, No. 1, Jan. 2017, first published Jul. 2016, IEEE, pp. 493-502.

Jain, S., "MEMO-ESPRIT based synchronized harmonic measurement for online applications," 2016 International Conference on Emerging Trends in Electrical Electronics & Sustainable Energy Systems (ICETEESES), Mar. 11-12, 2016, Sultanpur, India, IEEE, 7 pages.

Karimi-Ghartemani, M. et al., "Application of Enhanced Phase-Locked Loop System to the Computation of Synchrophasors," IEEE Transactions on Power Delivery, vol. 26, No. 1, Jan. 2011, first published Sep. 2016, IEEE, pp. 22-32.

Macii, D. et al., "Accuracy Analysis and Enhancement of DFT-Based Synchrophasor Estimators in Off-Nominal Conditions," IEEE Transactions on Instrumentation and Measurement, vol. 61, No. 10, Oct. 2012, first published Jun. 2012, IEEE, pp. 2653-2664.

McKinney, W. et al., "Data Structures for Statistical Computing in Python," Proceedings of the 9th Python in Science Conference (SCIPY 2010), Jan. 2010, pp. 56-61.

Muscas, C. et al., "Impact of Different Uncertainty Sources on a Three-Phase State Estimator for Distribution Networks," IEEE Transactions on Instrumentation and Measurement, vol. 63, No. 9, Sep. 2014, first published Mar. 2014, IEEE, pp. 2200-2209.

Orallo, C.M. et al., "Comparative analysis of DFT-based synchrophasor estimators," 2018 Argentine Conference on Automatic Control (AADECA), Nov. 7-9, 2018, Buenos Aires, Argentina, IEEE, 6 pages.

Petri, D. et al., "A Frequency-Domain Algorithm for Dynamic Synchrophasor and Frequency Estimation," IEEE Transactions on Instrumentation and Measurement, vol. 63, No. 10, Oct. 2014, first published Mar. 2014, IEEE, pp. 2330-2340.

Platas-Garza, M. et al., "Dynamic Phasor and Frequency Estimates Through Maximally Flat Differentiators," IEEE Transactions on Instrumentation and Measurement, vol. 59, No. 7, Jul. 2010, pp. 1803-1811.

Raspberry Pi Foundation, "Raspberry Pi4," retrieved Jul. 30, 2020, available from the Internet: [URL: https://web.archive.org/web/20211009083440/https://www.raspberrypi.com/products/raspberry-pi-4-model-b/], 13 pages.

Romano, P. et al., "Enhanced Interpolated-DFT for Synchrophasor Estimation in FPGAs: Theory, Implementation, and Validation of a

(56) References Cited

OTHER PUBLICATIONS

PMU Prototype," IEEE Transactions on Instrumentation and Measurement, vol. 63, No. 12, Dec. 2014, first published May 2014, IEEE, pp. 2824-2836.

Roy, R. et al., "ESPRIT—A subspace rotation approach to estimation of parameters of cisoids in noise," IEEE Transactions on Acoustics, Speech, and Signal Processing, vol. 34, No. 5, Oct. 1986, IEEE, pp. 1340-1342.

Roy, R. et al., "ESPRIT-estimation of signal parameters via rotational invariance techniques," IEEE Transactions on Acoustics, Speech, and Signal Processing, vol. 37, No. 7, Jul. 1989, IEEE, 12 pages.

Stenbakken, G.N. et al., "Calculating combined amplitude and phase modulated power signal parameters," 2011 IEEE Power and Energy Society General Meeting, Jul. 24-28, 2011, Detroit, MI, USA, IEEE, 7 pages.

Stoica, P. et al., "Spectral Analysis of Signals," Pearson Prentice Hall, 2005, 474 pages.

Stoica, P. et al., "Statistical analysis of MUSIC and ESPRIT estimates of sinusoidal frequencies," ICASSP 91: 1991 International Conference on Acoustics, Speech, and Signal Processing, Apr. 14-17, 1991, Toronto, ON, Canada, IEEE, pp. 3273-3276.

Van Der Walt, S. et al., "The NumPy array: a structure for efficient numerical computation," arXiv: 1102.1523v1 [cs.MS], Feb. 8, 2011, 8 pages.

Zuo, Y. et al., "Impact of Synchrophasor Estimation Algorithms in ROCOF-Based Under-Frequency Load-Shedding," IEEE Transactions on Power Systems, vol. 35, No. 2, Aug. 2019, IEEE, pp. 1305-1316.

\* cited by examiner

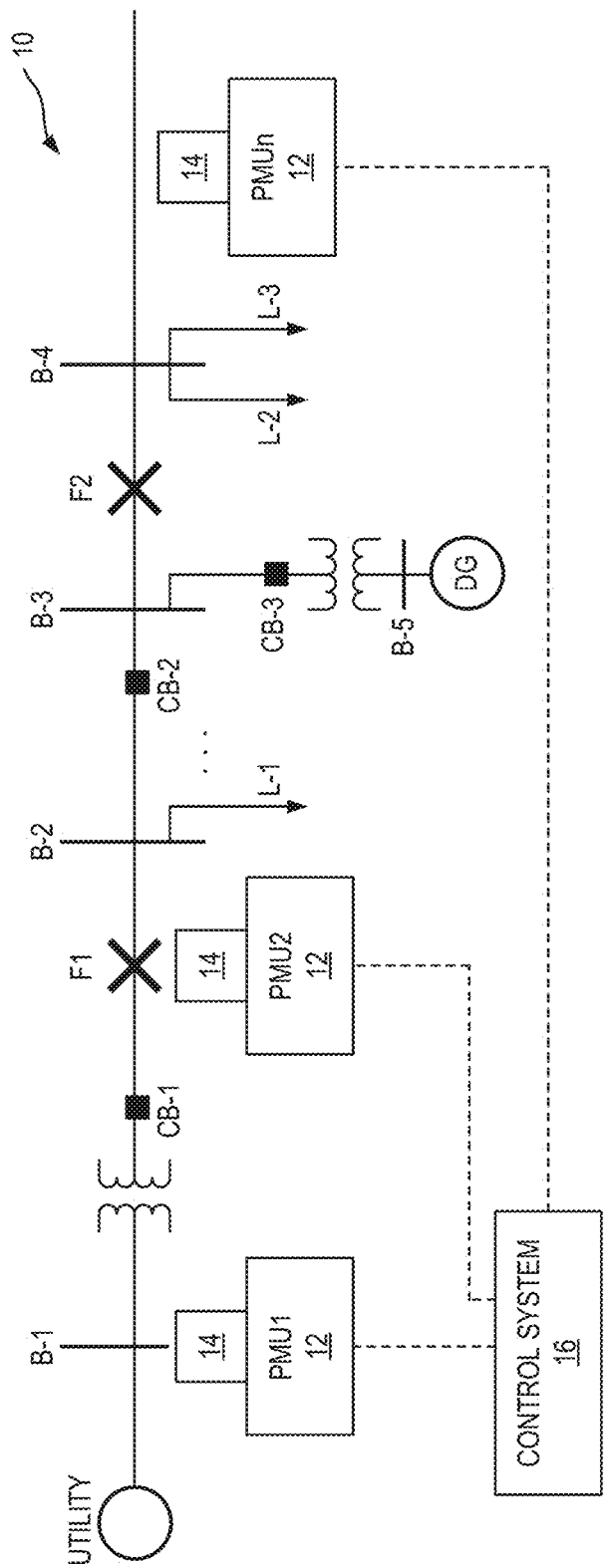
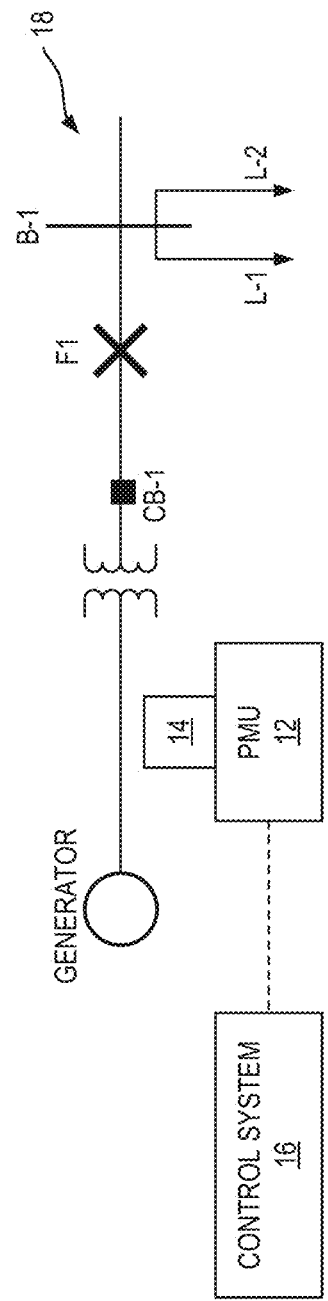
FIG. 1A
FIG. 1B

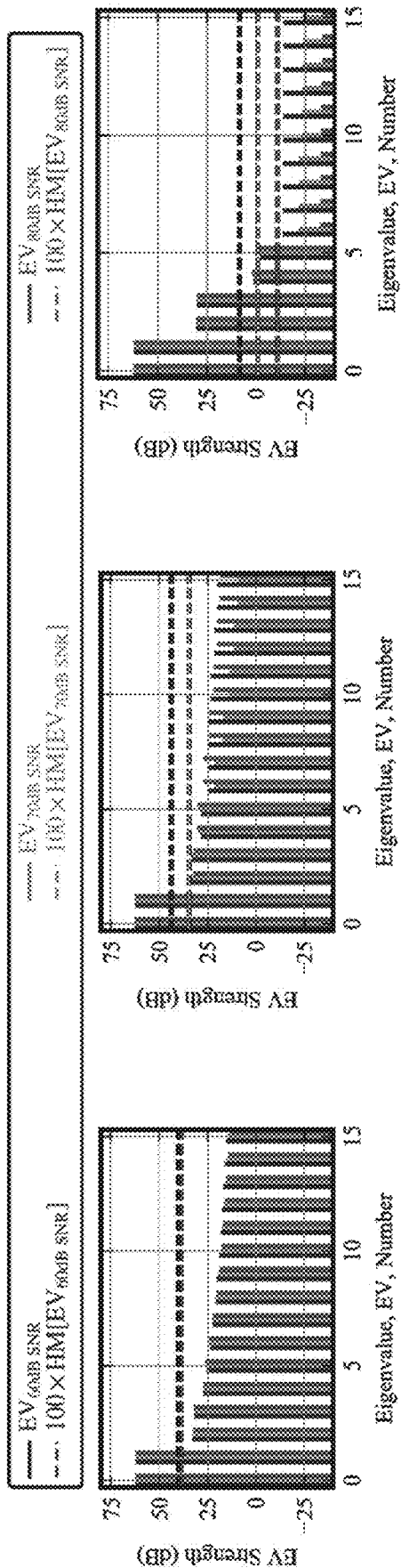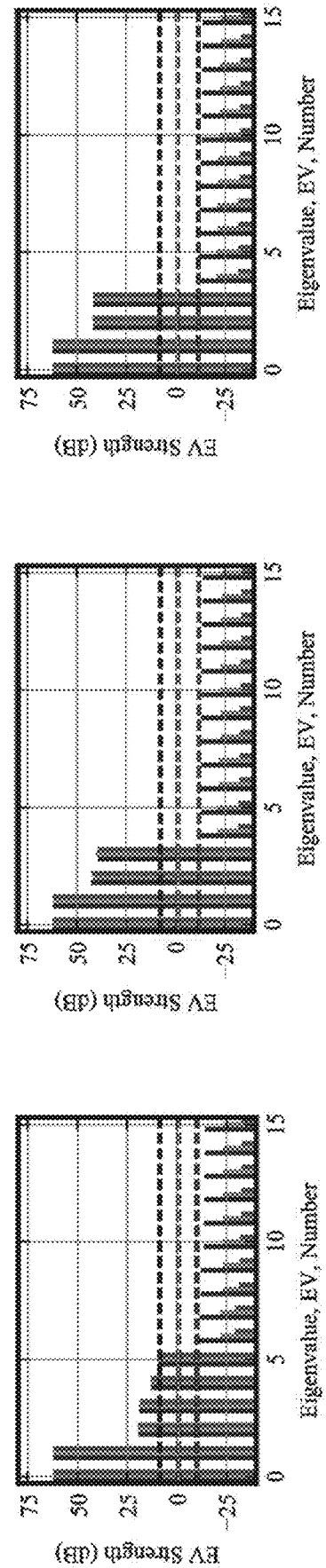
FIG. 4A  FIG. 4B  FIG. 4C
FIG. 4D  FIG. 4E  FIG. 4F

SUBSPACE-BASED APPROACH TO SYNCHROPHASOR ESTIMATION

RELATED APPLICATIONS

This application claims the benefit of provisional patent application Ser. No. 63/129,970, filed Dec. 23, 2020, the disclosure of which is hereby incorporated herein by reference in its entirety.

GOVERNMENT SUPPORT

This invention was made with government support under W911NF-15-2-0086 awarded by the Army Research Office. The government has certain rights in the invention.

FIELD OF THE DISCLOSURE

The present disclosure relates to phasor measurement and estimation for power distribution systems.

BACKGROUND

Data produced by phasor measurement units (PMUs) is used in control applications such as frequency control, voltage stability, and model estimation of a power system. PMU algorithms are even being designed with specific power systems in mind, such as smart grids. PMUs are being used to automate the operation of microgrids, a situation where fast and accurate state estimation is important. To ensure different PMUs produce similar results across a spectrum of power system conditions, the Institute of Electrical and Electronic Engineers (IEEE) Standard C37.118.1, and later the International Electrotechnical Commission (IEC)/IEEE Synchrophasor for Power Systems—Measurement Standard IEC/IEEE 60255-118-1, defines the operating characteristics and accuracy of PMUs, allowing developers and manufacturers the ability to design their own PMU algorithms while still guaranteeing a certain degree of accuracy and responsiveness.

Many PMU algorithms have been proposed for synchrophasor estimation. One basis for these algorithms is the discrete Fourier transform (DFT). The interpolated DFT (IpDFT) involves sampling a signal at a much higher rate than the frequency of interest. The synchrophasor amplitude, phase, frequency, and rate-of-change-of-frequency (RO-COF) can be estimated through interpolating DFT bins around the main lobe. Many analyses and comparisons of IpDFT-based algorithms exist.

One drawback to the IpDFT method is the problem of spectral leakage from either the negative image, harmonics, or other interference frequencies. Some techniques to mitigate the errors from the negative image include phase-locked-loops, the Hilbert transform, and an iterative method known as enhanced IpDFT (e-IpDFT), which can be implemented on a field-programmable gate array (FPGA). Some methods have been proposed to deal with spectral leakage from harmonics as well as inter-harmonic interference such as the iterative-IpDFT (i-IpDFT) (described in A. Derviškadić, P. Romano, and M. Paolone, "Iterative-Interpolated DFT for Synchrophasor Estimation: A Single Algorithm for P- and M-Class Compliant PMUs," *IEEE Transactions on Instrumentation and Measurement*, vol. 67, no. 3, pp. 547-558, March 2018, referred to herein as "Derviškadić"). The i-IpDFT improves upon the e-IpDFT algorithm by incorporating an iterative method to deal with spectral leakage from the negative image, harmonics, and inter-harmonic interference. The results presented in Derviškadić are for two different windows (cosine and Hanning) and show that compensation for inter-harmonic distortion is possible with an IpDFT-based algorithm.

Other common synchrophasor estimation algorithm styles are those based on the Taylor Weighted Least Squares (TWLS). TWLS algorithms are time-domain-based as opposed to frequency-domain-based and incorporate dynamic components into the synchrophasor model, allowing for better synchrophasor estimates in dynamic conditions (frequency or amplitude modulation). TWLS methods use a Taylor expansion of the reference phasor, resulting in a dynamic synchrophasor model that handles dynamic conditions better. TWLS methods employ weights to minimize approximation errors at the window edges. If a frequency estimate is provided by another algorithm, the TWLS can be generalized. This combination of frequency estimate with TWLS is known as the generalized TWLS (GTWLS) method. The GTWLS method is generally considered to be computationally intensive, but progress has been made in reducing this burden.

SUMMARY

A subspace-based approach to synchrophasor estimation is provided. Embodiments described herein provide two improvements to subspace-based phasor measurement unit (PMU) algorithms based on estimation of signal parameters via rotational invariance techniques (ESPRIT) frequency estimation. The first is a dynamic, real-time thresholding method to determine the size of the signal subspace. This allows for accurate ESPRIT-based frequency estimates of the nominal system frequency as well as the frequencies of any out-of-band interference or harmonic frequencies. Since other frequencies are included in the least squares (LS) estimate, the interference from frequencies other than nominal can be excluded. This results in a near flat estimation error over changes in a) nominal system frequency, b) harmonic distortion, and c) out-of-band interference. Second, the computational burden of ESPRIT is reduced and the proposed algorithm runs in real time on resource-constrained platforms.

An exemplary embodiment provides a method for synchrophasor estimation for a power distribution system, the method comprising: receiving a measured signal; estimating a subspace size of the measured signal using a threshold based on a harmonic mean of the measured signal; calculating frequencies in the measured signal using the subspace size; and using the calculated frequencies to produce a synchrophasor estimate of the measured signal.

Another exemplary embodiment provides a PMU, comprising: a power coupler; and a signal processor connected to the power coupler and configured to: receive a measured signal from the power coupler; estimate a subspace size of the measured signal using a threshold based on a harmonic mean of the measured signal; and using the estimated subspace size, estimate a synchrophasor of a power distribution system.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 1A is a single line schematic diagram of an exemplary power distribution system including one or more phasor measurement units (PMUs) according to embodiments described herein.

FIG. 1B is a single line schematic diagram of an exemplary micro power system including one or more PMUs according to embodiments described herein.

FIG. 4A is a graph of eigenvalue (EV) strength of the largest 16 EVs and corresponding harmonic thresholds for magnitude step (10% nominal magnitude positive step).

FIG. 4B is a graph of EV strength of the largest 16 EVs and corresponding harmonic thresholds for phase step ($\pi/18$ positive step).

FIG. 4C is a graph of EV strength of the largest 16 EVs and corresponding harmonic thresholds for magnitude modulation (modulation frequency of 5 Hz).

FIG. 4D is a graph of EV strength of the largest 16 EVs and corresponding harmonic thresholds for phase modulation (modulation frequency of 5 Hz).

FIG. 4E is a graph of EV strength of the largest 16 EVs and corresponding harmonic thresholds for out-of-band (OOB) interference (reference frequency of 47.5 Hz and interference frequency of 25 Hz at 10% signal power).

FIG. 4F is a graph of EV strength of the largest 16 EVs and corresponding harmonic thresholds for harmonic distortion (second harmonic with harmonic power of 10%).

DETAILED DESCRIPTION

Figure 2:
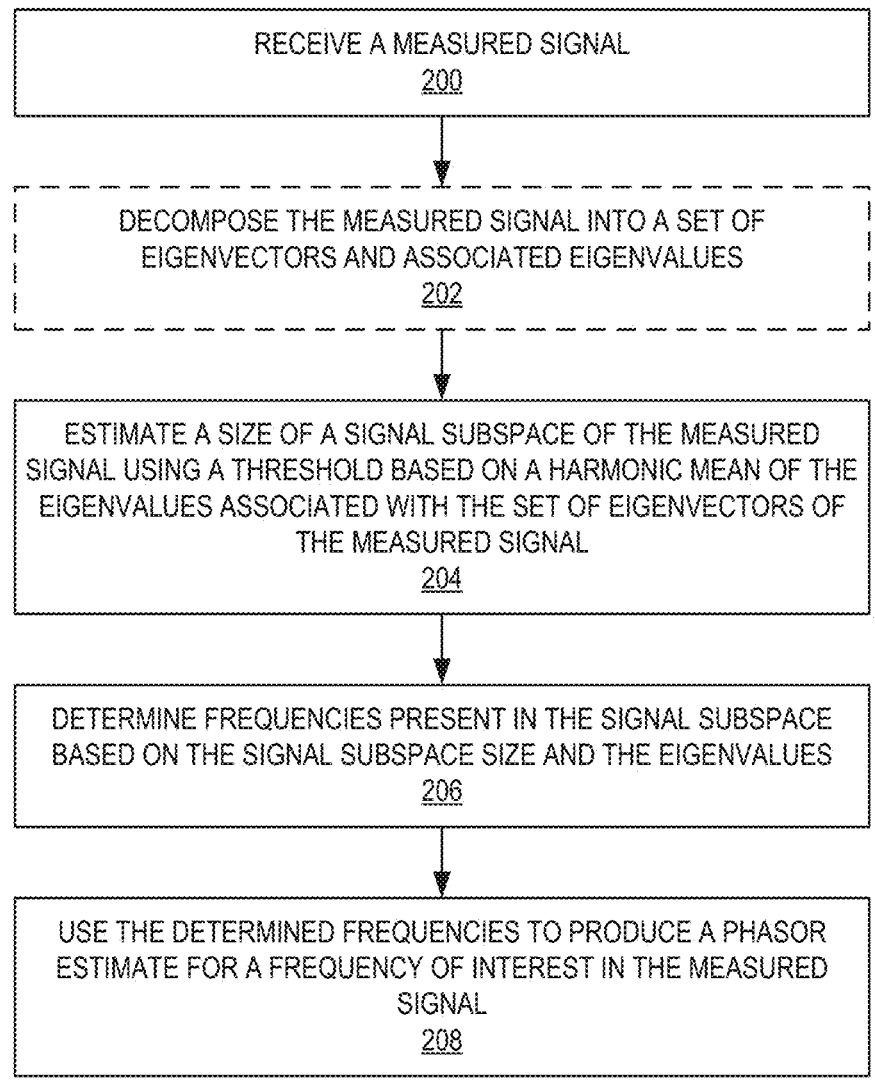
FIG. 2 is a flow diagram of a process for phasor estimation according to embodiments described herein.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the FIGS. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

A subspace-based approach to synchrophasor estimation is provided. Embodiments described herein provide two improvements to subspace-based phasor measurement unit (PMU) algorithms based on estimation of signal parameters via rotational invariance techniques (ESPRIT) frequency estimation. The first is a dynamic, real-time thresholding method to determine the size of the signal subspace. This allows for accurate ESPRIT-based frequency estimates of the nominal system frequency as well as the frequencies of any out-of-band interference or harmonic frequencies. Since other frequencies are included in the least squares (LS) estimate, the interference from frequencies other than nominal can be excluded. This results in a near flat estimation error over changes in a) nominal system frequency, b) harmonic distortion, and c) out-of-band interference. Second, the computational burden of ESPRIT is reduced and the proposed algorithm runs in real time on resource-constrained platforms.

I. Introduction

In addition to the synchrophasor estimation algorithms described above, subspace-based methods can be used in PMUs for synchrophasor estimation. One prior approach examined using an ESPRIT-based method to estimate the system frequency using total least squares (TLS)-ESPRIT. The synchrophasor magnitude is determined via an LS fit, and the phase is estimated using the propagator method, or an LS estimate of the synchrophasor can be done directly. Since the ESPRIT algorithm assumes stationary signals, performance during transients or modulation can suffer. Accuracy during transients is improved by using a Taylor series expansion of the fundamental frequency in the synchrophasor estimate. However, ESPRIT-based estimators require an appropriate estimation of the number of source frequencies to ensure proper frequency estimation, which can be hard to do without a priori knowledge. The prior approach solved this with a static threshold, which was experimentally determined for various signal-to-noise ratio (SNR) and data window size combinations.

Embodiments described herein propose an automatic source order estimation using a unique harmonic-mean (HM) dynamic threshold algorithm that adjusts with changing noise variance. Using the proposed method, the size of the signal subspace can be identified, providing an accurate frequency estimate with ESPRIT. Another criticism of the ESPRIT algorithm is its associated computational complexity, which embodiments improve by using an optimized Eigenvalue (EV) decomposition instead of singular value decomposition (SVD), cutting the processing time roughly in half. Operation of the proposed algorithm is detailed on resource-constrained computing platforms, and embodiments can run in real-time. The resulting approach, referred to herein as HM-ESPRIT, is a robust and flexible subspace-based algorithm, and can be extended to track multiple harmonics.

FIG. 1A is a single line schematic diagram of an exemplary power distribution system 10 including one or more PMUs 12 according to embodiments described herein. Each PMU 12 includes or otherwise receives a measured signal from a power coupler 14. The measured signal can be a voltage signal, current signal, or other signal of interest for which phasors (e.g., synchrophasors or other phasors) are to be estimated. In some embodiments, the power coupler 14 includes a voltage sensor (e.g., voltage tap) or a current sensor (e.g., current clamp).

PMUs 12 can be installed at one or more points along feeders of the power distribution system 10. For example, PMU1 can be installed at a higher voltage branch feeder B-1, PMU2 can be installed at a lower voltage fuse F1, and so on. The one or more PMUs 12 can provide phasor estimates to a control system 16 for further evaluation and/or control of the power distribution system 10.

FIG. 1B is a single line schematic diagram of an exemplary micro power system 18 including one or more PMUs 12 according to embodiments described herein. In the illustrated example, power may be locally generated for a micro grid, and therefore only a small number of PMUs 12 (e.g., as few as one) may be needed to measure phasors of interest.

FIG. 2 is a flow diagram of a process for phasor estimation according to embodiments described herein. Dashed boxes represent optional steps. The process begins at operation 200, with receiving a measured signal. In an exemplary aspect, the measured signal is a voltage signal or a current signal (e.g., for the power distribution system 10 or the micro power system 18). The process may optionally continue at operation 202, with decomposing the measured signal into a set of Eigenvectors and associated Eigenvalues. The process continues at operation 204, with estimating a size of a signal subspace of the measured signal using a threshold based on a harmonic mean of the Eigenvalues associated with the set of Eigenvectors of the measured signal.

The process continues at operation 206, with determining frequencies present in the signal subspace based on the signal subspace size and the Eigenvalues. In an exemplary aspect, the signal subspace comprises vectors within the set of Eigenvectors of the measured signal corresponding to Eigenvalues above the harmonic mean. In another aspect, a noise subspace comprises vectors within the set of Eigenvectors of the measured signal corresponding to Eigenvalues below the harmonic mean.

The process continues at operation 208, with using the determined frequencies to produce a phasor estimate for a frequency of interest in the measured signal. In an exemplary aspect, multiple phasor estimates may be produced for multiple frequencies of interest. Further details of this process are described below with respect to FIG. 3.

II. Proposed PMU Algorithm: HM-ESPRIT

A. Measurements Reported by PMUs

The 2018 PMU Standard defines a reported "frame" as a timestamp, synchrophasor measurement, frequency measurement, and a rate-of-change-of-frequency (ROCOF) measurement. A synchrophasor is a phasor representation of a sinusoid with the angle of the phasor referenced to the angle of a cosine function at the nominal system frequency:

$$X(t) = \frac{X_m(t)}{\sqrt{2}} e^{j\phi(t)} \qquad \text{Equation 1}$$

where $X_m(t)$ is the magnitude of the fundamental phasor and $\phi(t)$ is the relative phase angle defined by:

$$\phi(t) = \theta(t) - 2\pi f_0 t \qquad \text{Equation 2}$$

where $\theta(t)$ is the angular position of the fundamental phasor ($\angle X(t)$ if X is a complex phasor) and $f_0$ is the nominal system frequency, typically 50 Hz or 60 Hz. The frequency and ROCOF are defined as the first and second derivative of $\phi(t)$, respectively.

The 2018 PMU Standard defines testing and error requirements for different frame reporting rates, $F_s$. These rates can vary from 10 Hz to 100 or 120 Hz for 50 Hz or 60 Hz power systems.

B. HM-ESPRIT

Figure 3:
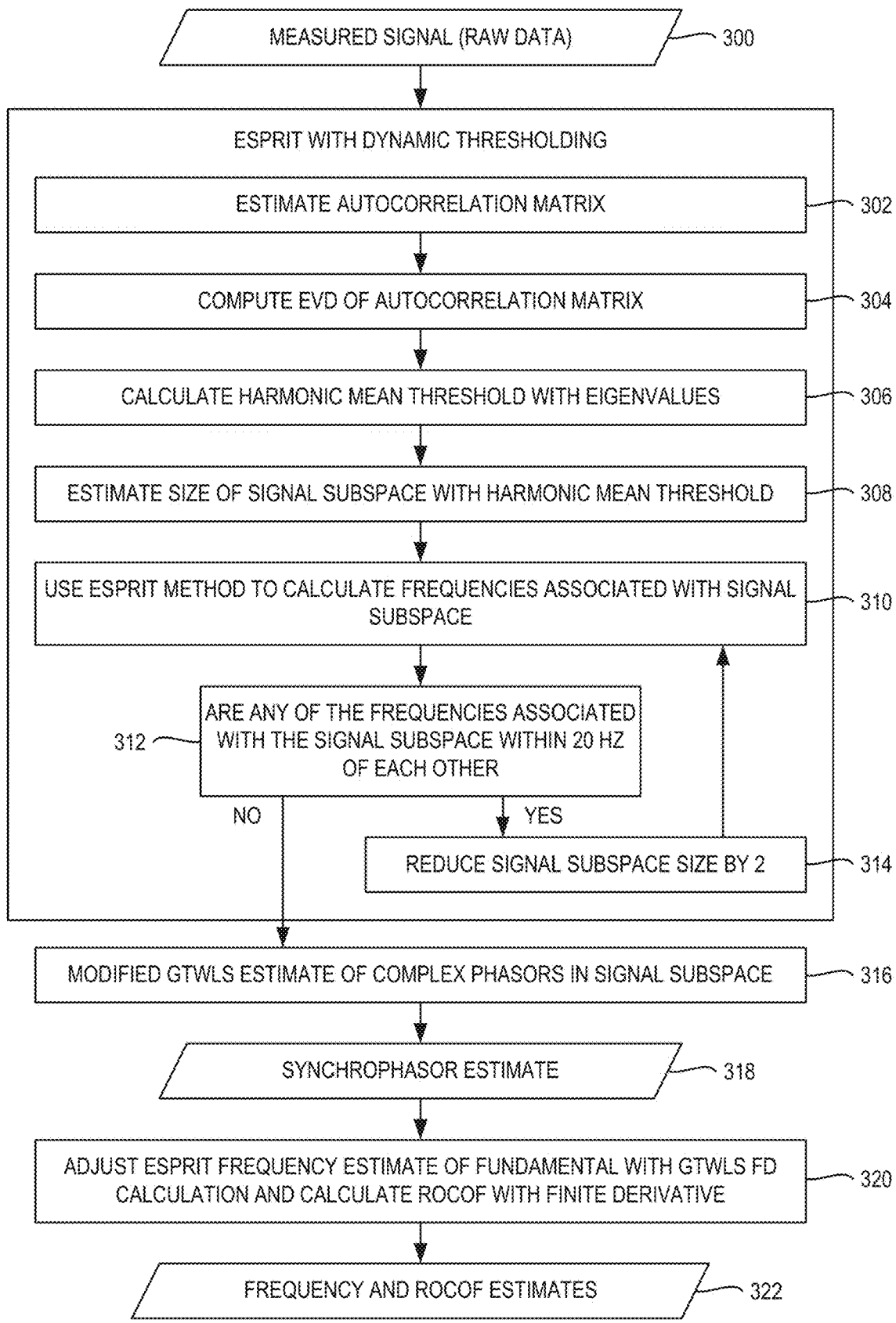
FIG. 3 is a flow diagram of an exemplary embodiment of harmonic-mean estimation of signal parameters via rotational invariance techniques (HM-ESPRIT).

FIG. 3 is a flow diagram of an exemplary embodiment of HM-ESPRIT. First, a measured signal (e.g., raw data from a power coupler) is received (block 300) and an autocorrelation matrix of the measured signal is estimated (block 302). The Eigenvalues (EVs) and associated Eigenvectors of the autocorrelation matrix are calculated using an $0(n^2)$ EV decomposition (EVD) (block 304). The size of the signal subspace is estimated using a threshold based on the harmonic mean (blocks 306, 308). This method correctly identifies the size of the signal subspace without a priori knowledge and across various SNR conditions without modification.

With the signal subspace correctly identified, the ESPRIT algorithm estimates the frequencies of all signal tones present in the raw data (block 310). These frequencies are compared for closeness in the frequency domain (block 312); if frequencies are found to be within a certain limit of each other, then the signal subspace is reduced by two (the positive and negative frequencies for a given tone) by removing the two smallest EVs (block 314). Details on why this is necessary are discussed in Section II-B2. If the signal subspace was reduced, the frequencies are recalculated for the new signal subspace (block 310).

Once all frequencies are sufficiently separated, complex wave vectors are generated for each frequency present in the signal subspace and an LS estimate of complex phasors for every frequency present in the raw data is made (block 316). For the fundamental frequency, a Taylor expansion of order k=2 is used to incorporate dynamic changes into the signal model. The complex phasor closest to nominal system frequency is kept and the phase adjusted to make a synchrophasor (block 318). The frequency estimate is provided by the ESPRIT algorithm, and ROCOF is calculated as the derivative of the frequency estimate over time (blocks 320, 322).

An exemplary embodiment provides a non-contact PMU, comprising; electric and magnetic field sensors (such as those described in US10775420B2) to provide a measurement signal proportional to the voltage on and current through the conductors, respectively; using an estimated subspace size; using an estimated synchrophasor of the power system to trigger relays and interlocks for load shedding, frequency stabilization, or equipment protection.

1. The ESPRIT Algorithm

An estimate of the signal frequencies is performed using the LS ESPRIT algorithm. ESPRIT is often used for estimation of frequency and direction of arrival due to its high degree of accuracy. The LS-ESPRIT algorithm uses a signal model assumed to be a linear combination of d complex sinusoids:

$$x_i = As + n \qquad \text{Equation 3}$$

where $x_i$ is a length m vector of sampled waveform data starting at sample i, s is a length d vector of complex amplitudes representing the complex magnitudes of the d signals, and n is a length m vector of zero-mean Additive White Gaussian Noise (AWGN). Finally, $A = [a_1 | a_2 | \ldots | a_d]$ where each vector $a_k$ is a complex unit wave vector corresponding to the frequency associated with the kth signal, $a_k = [e^{jw_k n}, e^{jw_k(n+1)}, \ldots, e^{jw_k(n+m)}]^T$. Under the assumption of a stationary signal, x can be related to itself at a future time via the rotational matrix $\Phi$:

$$y = x_{i+1} = A\Phi s + n \qquad \text{Equation 4}$$

where $\Phi = \text{diag}\{e^{w_1}, e^{w_2}, \ldots, e^{w_d}\}$. The stationary assumption is needed to relate a signal to itself one time step in the future. This assumption of stationary signals does not hold during, e.g., frequency sweeps. Therefore, a dynamic signal model is adopted later when a modified General Taylor Weighted Least Squares (GTWLS) method is used to calculate complex phasors of signals present in the data.

The complex angular frequencies in $\Phi$ can be found by solving the following matrix pencil:

$$R_{xx} = \mathbb{E}[xx^*] = ASA^* + \sigma^2 I$$

$$R_{xy} = \mathbb{E}[xy^*] = AS\Phi^* A + \sigma^2 I_{-1}$$

$$R_{xx} - \gamma R_{xy} = AS(I - \gamma \Phi^*) A^* = \qquad \text{Equation 5}$$

with generalized EVs: $\gamma_k = e^{jw_k}$ and $S = \text{diag}\{|s_1|^2, \ldots, |s_d|^2\}$ are the powers of the signals present in the raw data.

In practice, these EVs are typically estimated through LS estimation between the autocorrelation matrix's signal subspace at shifted points in time. This entails using Singular Value Decomposition (SVD) to determine the Eigenvectors present in the autocorrelation matrix $R_{xx}$, and extracting only the Eigenvectors corresponding to the d largest EVs. Using $R_{xx}=U\Sigma V^T$ and $V_{sig,x}=V[0: m-1, 0: d]$ and $V_{sig,y}=V[1: m, 0: d]$, the generalized EVs can be estimated as follows:

$$\Psi=(V_{sig,x}{}^T V_{sig,x})^{-1} V_{sig,x}{}^T V_{sig,y} \quad \text{Equation 6}$$

where the EVs of $\Psi$ are the d complex angular frequencies corresponding to the frequencies of the signal subspace.

Using the a priori knowledge that the sampled waveform data is real, and the autocorrelation matrix is symmetric, SVD can be foregone in favor of an optimized EV decomposition, which can be considerably faster. The speed-up comes from the difference in computational complexity of each algorithm. SVD (as implemented in the LAPACK package xGESVD) is at worst $0(n^3)$ while the optimized EVD (the LAPACK package xSYEVR) is at worst $0(n^2)$.

Regardless of how the signal subspace size was determined, ESPRIT produces frequency estimates from the d Eigenvectors associated with the d largest EVs. Because the data is sinusoidal, sinusoids of different frequencies are orthogonal to each other (true for infinite time spans, this starts to breakdown when considering finite time windows), and that EVD decomposes a matrix into orthogonal vectors it can be expected that the d Eigenvectors are approximately sinusoidal in nature. In the context of ESPRIT frequency estimation, each Eigenvector (and corresponding EV) can be thought of as corresponding to a frequency present in the data, with the magnitude of the EV compared to other EVs as a relative measure of the power in that frequency. The next section discusses how analysis of the EVs can be used to estimate the signal subspace size, d.

2. Harmonic Threshold for an Initial Estimate of the Signal Subspace Size

Incorrect signal subspace size estimates can affect the accuracy of the ESPRIT frequency estimates. This section presents a method for dynamically determining the size of the signal subspace that adjusts with noise and window size.

To illustrate the issues that can arise from incorrect signal number estimation, consider the case where the signal subspace is overestimated. There are now Eigenvectors from the noise subspace included in $V_{sig}$ in Equation 6. When the LS algorithm minimizes the residuals, the estimate of $\Psi$ will be partially fit to noise. Conversely, if the signal subspace is underestimated, frequencies that are present in the raw data will be treated as noise and the LS estimate of $\Psi$ will minimize error with respect to a portion of the signal space. In both cases, the estimate of $\Psi$ (and the corresponding EVs representing frequencies present in the data) will degrade.

One prior approach used a method of determining the size of the signal subspace which relied on comparing singular values to fixed thresholds. The ratio $\log(s_k)/\log(s_1)$ was compared to an experimentally chosen threshold for specific combinations of SNR and data window size. This correctly separated the signal and noise subspace, but thresholds had to be heuristically determined for different SNRs and data window sizes. Given that noise can vary over time, a dynamic method of estimating the signal subspace size is needed for use of the ESPRIT algorithm with real world raw data.

In HM-ESPRIT, the threshold is determined via the harmonic mean of the absolute value of all EVs. The harmonic mean operator, HM[.], for a vector of length m is defined as:

$$HM[x] = \frac{m}{1/x_1 + 1/x_2 + \ldots 1/x_m} \quad \text{Equation 7}$$

The harmonic mean is used because it de-weights contributions from large numbers. If it is assumed that $d \ll m$ and the power in the signal subspace is greater than the power in the noise subspace, then the harmonic mean of the EVs should approximate the noise variance. The dynamic threshold is then set to $100 \times HM[EV s]$. For each $s_k$, if the EV is above this threshold it is a candidate for the signal subspace; otherwise, it is assigned to the noise subspace.

FIG. 4A is a graph of EV strength of the largest 16 EVs and corresponding harmonic thresholds for magnitude step (10% nominal magnitude positive step). FIG. 4B is a graph of EV strength of the largest 16 EVs and corresponding harmonic thresholds for phase step ($\pi/18$ positive step). FIG. 4C is a graph of EV strength of the largest 16 EVs and corresponding harmonic thresholds for magnitude modulation (modulation frequency of 5 Hz). FIG. 4D is a graph of EV strength of the largest 16 EVs and corresponding harmonic thresholds for phase modulation (modulation frequency of 5 Hz). FIG. 4E is a graph of EV strength of the largest 16 EVs and corresponding harmonic thresholds for out-of-band (OOB) interference (reference frequency of 47.5 Hz and interference frequency of 25 Hz at 10% signal power). FIG. 4F is a graph of EV strength of the largest 16 EVs and corresponding harmonic thresholds for harmonic distortion (second harmonic with harmonic power of 10%).

FIGS. 4A-4F illustrate the dynamic nature of the harmonic mean threshold. As the SNR varies from 60 dB to 80 dB, the harmonic mean threshold adjusts to capture the change in power of the noise subspace. The harmonic threshold only determines candidates for the signal subspace; additional processing is needed to distinguish between stationary and dynamic signal conditions.

Consider a dynamic signal test (magnitude modulation) and a steady state test (OOB interference) in FIG. 4C and FIG. 4E, respectively. In the case of magnitude modulation (FIG. 4C), there are three frequencies present (the fundamental and two sidebands). This is indicated by the first six EVs being significantly stronger than the rest (both positive and negative frequencies must be accounted for, so three present frequencies become six). With a data window spanning three cycles of the nominal system frequency, the side bands cannot be easily resolved as indicated in the significant difference between the second pairing of EVs (EV 2 and 3) compared to the third pairing of EVs (EV 4 and 5). In this scenario, treating the data as though only one frequency is present and relying on the GTWLS dynamic phasor model yields estimation errors that still exceed the 2018 PMU Standard's error requirements.

To detect situations where apparent frequency components should be discarded, HM-ESPRIT compares frequency estimates from ESPRIT (using the signal subspace determined by the HM threshold) and if two frequencies are less than 20 Hz apart it lowers the signal subspace size by 2 and recalculates the frequency estimates with ESPRIT again. This correctly identifies cases of magnitude modulation and leads to the correct estimate of d, the size of the signal subspace. For the case of OOB interference (FIG. 4E), the frequency estimates are larger than 20 Hz apart. In this case, the size of the signal subspace is already correctly identified, and no reduction is needed. The combination of an HM threshold and intelligent comparison of frequencies present in the signal subspace allow HM-ESPRIT to deal with all test cases specified by the 2018 PMU Standard, including OOB interference for M-class test cases.

The choice of the 20 Hz threshold that is used to detect when the signal subspace needs to be reduced was made with a few considerations in mind. First, in steady state cases with other signals present (e.g., OOB interference or harmonic distortion), these frequencies tend to be farther than 20 Hz apart. For the case of a 50 Hz nominal signal with a 50 fps reporting rate, the closest any two frequencies will be during OOB interference testing is 47.5 Hz–25 Hz=22.5 Hz. Second, the separation of frequency estimates produced by ESPRIT for modulation cases is bounded by the modulation frequency. This implies that the 20 Hz threshold could be dropped as low as 5 Hz (the maximum modulation frequency required for testing by the 2018 PMU Standard). Similar bounding exists during a frequency ramp test. However, with real world data it is observed that a lower threshold tends to produce erroneous results during large frequency or magnitude fluctuations. As a result, to err on the side of caution embodiments employ a frequency closeness threshold of 20 Hz to allow for dealing with extreme dynamic fluctuations.

A shortcoming of this method is that if there truly are two signal frequencies separated by less than 20 Hz (e.g., a 50 Hz signal on a 60 Hz power system) then they will not be identified as separate signals and can lead to anomalous results. However, for tests of modulation, the modulation frequency is often lower than 20 Hz. This means HM-ESPRIT correctly processes the majority of modulated signals. Additionally, for cases of harmonic distortion and OOB interference, the signals present exhibit frequencies that are larger than 20 Hz apart and are not removed.

Another issue that arises from this constraint is aliasing. At low sampling frequencies, and without proper anti-aliasing filters in place, it is possible for higher order harmonics or inter-harmonics to alias into the 40 Hz spacing around the nominal frequency. In these scenarios, HM-ESPRIT would incorrectly reduce the signal order size. With this in mind, the standard usage of HM-ESPRIT should also include antialiasing filters. This issue would affect other PMU algorithms as well as long as it is expected that frequencies are present that are above the Nyquist frequency relating to the chosen sampling frequency.

The combination of an HM threshold and a reduction of close frequencies allows HM-ESPRIT to deal with all test cases specified by the 2018 PMU Standard, including OOB interference for M-class test cases with the exception of ROCOF estimation. Additionally, since the HM thresholding method works with different SNRs without the need to change any of HM-ESPRIT's parameters, HM-ESPRIT can handle heteroscedastic data without redefining parameters based on the amount of noise present in the data.

3. Producing PMU Frames

With the signal subspace size correctly determined via the harmonic thresholding method, a dynamic phasor model can be adopted for the fundamental frequency of the form:

$$x(t) = Re\{\sqrt{2}p(t)e^{j2\pi f_0 t}\} + n(t) \qquad \text{Equation 8}$$

where p(t) is the dynamic phasor of the reference frequency $f_0$. HM-ESPRIT assumes n(t) represents AWGN. Following the GTWLS method, a Taylor expansion representation of p(t) can be used (typically a Taylor order of k=2 is sufficient):

$$p(t) \approx p(t_r) + p'(t_r)\Delta t + \frac{p''(t_r)}{2!}\Delta^2 t \qquad \text{Equation 9}$$

where $t_r$ is the reference time about which the Taylor expansion is calculated.

The GTWLS of estimate of p(t) and its derivatives at time $t_r$ is then:

$$\hat{P}_r = \{p^*{}_2, p^*{}_1, p^*{}_0, p_1, p_2\} = (A^H W^H W A)^{-1} A^H W^H W x \qquad \text{Equation 10}$$

where $p_k$ are the kth order Taylor coefficients. W=diag{$w_0$, $w_1$ . . . , $w_m$} where $w_k$ are coefficients of a Hamming window the same size as the data window being observed (m in this case). The columns of A are defined for the fundamental frequency (see M. A. P.-G. a. J. Platas-Garza and J. A. de la O Serna, "Dynamic Phasor and Frequency Estimates Through Maximally Flat Differentiators," *IEEE Transactions on Instrumentation and Measurement*, vol. 59, no. 7, pp. 1803-1811, July 2010, conference Name: IEEE Transactions on Instrumentation and Measurement).

One important extension to the above A that HM-ESPRIT adds is additional wave vectors that correspond to any other frequencies detected in the signal using ESPRIT. When other frequencies are determined to be present after the harmonic threshold, additional columns are added to A of the form $a_k = [e^{jw_k(-m/2)}, \ldots, e^{jw_k(0)}, \ldots, e^{jw_k([m/2])}]$, where [•] denotes integer rounding. The consequence of this is that both the dynamic phasor of the fundamental frequency and stationary contributions from interfering signals (such as OOB interference and harmonic distortion) are included in the WLS estimate of complex phasors. The resulting synchrophasor estimates correspond to d/2 signals and their complex conjugates, a total of d signals (recall that the fundamental frequency component is represented as a Taylor expansion of order 2). A prior approach used a version of this without weights. However, it is important to use a weighting window with the GTWLS method because the error in Taylor expansion estimate of p(t) increases with distance from $t_r$.

Finally, the reporting frame can be constructed. Only the synchrophasor estimate closest to the nominal system frequency needs to be kept. The magnitude is doubled (the power is split between the negative and positive frequency) and divided by $\sqrt{2}$ to estimate the RMS magnitude of the synchrophasor. Finally, the phase must be adjusted relative to a reference cosine phasor where zero phase corresponds to the 1 second rollover. Typically, the time source for calculating the phase reference comes from a GPS signal. The phase of the complex phasor to be reported in the center of the window is adjusted as follows:

$$\angle X_{adjusted} = \left[\left(\angle X - 2\pi f_0 \frac{t_{GPS}}{fs} + \pi\right) \mod(2\pi)\right] - \pi \qquad \text{Equation 11}$$

where $t_{GPS}$ is a timestamp obtained via some GPS signal at the center of the window, $f_s$ is the sampling rate, and $f_0$ is the nominal system frequency.

To finish off the PMU frame, estimates for frequency and ROCOF are needed. HM-ESPRIT employs a frequency deviation (FD) calculation (as described in D. Belega, D. Fontanelli, and D. Petri, "Dynamic Phasor and Frequency Measurements by an Improved Taylor Weighted Least Squares Algorithm," *IEEE Transactions on Instrumentation and Measurement*, vol. 64, no. 8, pp. 2165-2178, August 2015, referred to herein as "Belega") to adjust the original ESPRIT frequency estimate of the fundamental. This results in a better frequency estimate during dynamic signal conditions. ROCOF is then calculated as:

$$RO\hat{C}OF = |\hat{f}(i) - \hat{f}(i-1)| * F_s \qquad \text{Equation 12}$$

where $\hat{f}(i)$ and $\hat{f}(i-1)$ are the current PMU frames frequency estimate and the previous PMU frames frequency estimate, respectively. $F_s$ is the reporting rate of the PMU frames.

The derivative-based method of ROCOF calculation given above does introduce some latency to the reporting of ROCOF estimates, specifically $1/2F_s$ seconds. For some applications that rely on ROCOF estimates, this additional delay might be too great. A prior approach explored this under the context of under-frequency load shedding and load restoration. In these circumstances, another method of calculating ROCOF is available with the use of the GTWLS method. This ROCOF calculation can be found in Belega. This method does not suffer the additional latency that the derivative-based method does, but also tends to be less accurate. As shown in Section III, the derivative-based method shown above fails the signal frequency steady state tests when an SNR of 60 dB is used. The GTWLS-based method in Belega fails the same test at an SNR of 70 dB, a more advantageous SNR. The tradeoff between latency and ROCOF estimation accuracy is application dependent and can be switched accordingly.

4. Demonstration of HM-ESPRIT Under High Interference Conditions

Figure 5A:
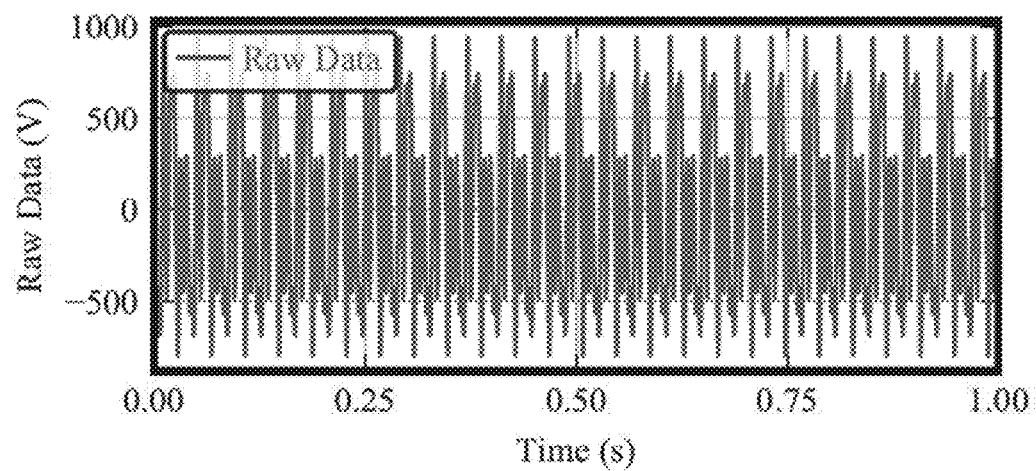
FIG. 5A is a graphical representation of one second of raw data with four frequencies plus a nominal system frequency present.
Figure 5B:
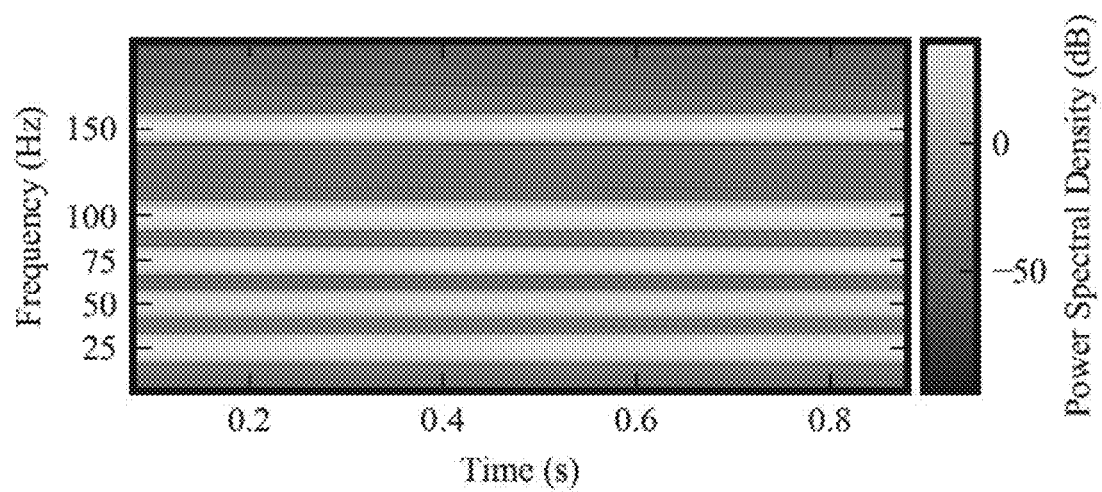
FIG. 5B is a graphical representation of a power spectrogram of the raw data of FIG. 5A.

FIG. 5A is a graphical representation of one second of raw data with four frequencies plus a nominal system frequency present. FIG. 5B is a graphical representation of a power spectrogram of the raw data of FIG. 5A. FIGS. 5A and 5B illustrate how effective estimating the frequencies of all tones present in raw data can be. In this case, there are five signals; the fundamental tone at 50 Hz and 120 $V_{RMS}$ and four additional tones at 25 Hz, 75 Hz, 100 Hz, and 150 Hz, each with 240 $V_{RMS}$ magnitude and random phase. AWGN was added such that $P_{60\ Hz}/P_{AWGN}$=60 dB. The data was sampled at 8 kHz with a frame reporting rate of 50 fps.

Figure 6A:
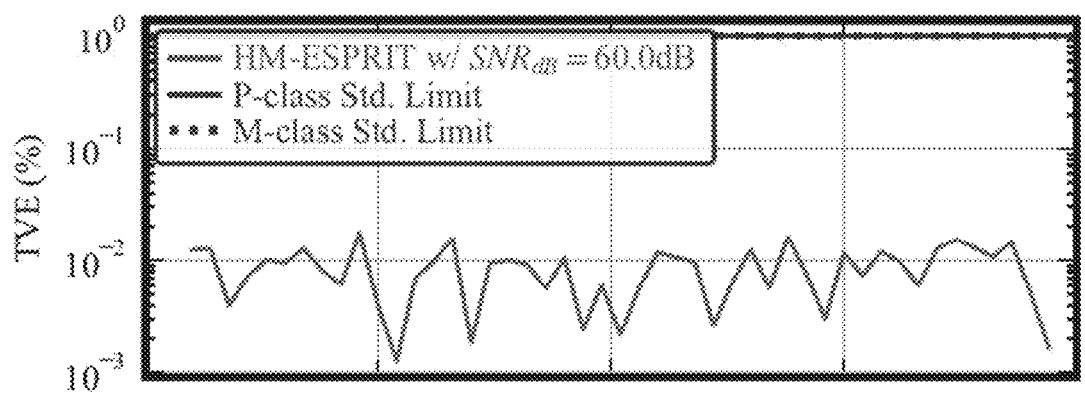
FIG. 6A is a graphical representation of HM-ESPRIT total vector error (TVE) when multiple, strong interference tones are present.
Figure 6B:
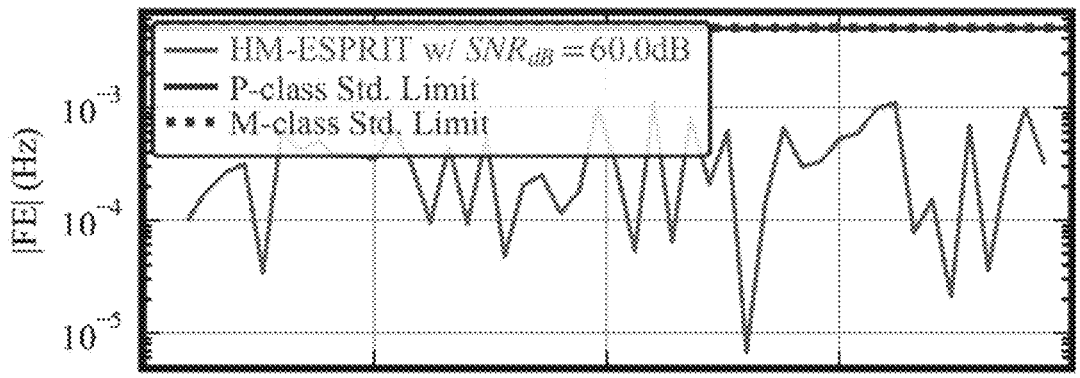
FIG. 6B is a graphical representation of HM-ESPRIT absolute frequency error (|FE|) when multiple, strong interference tones are present.
Figure 6C:
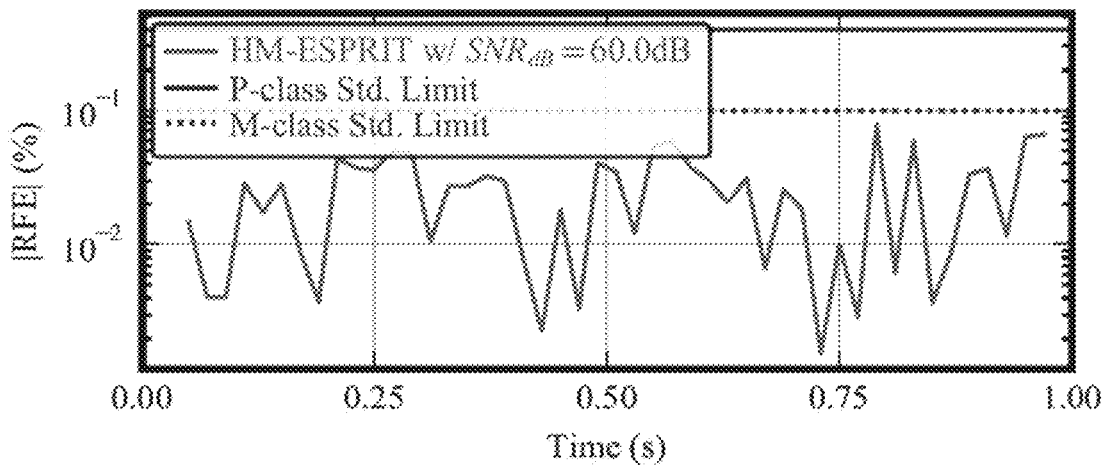
FIG. 6C is a graphical representation of HM-ESPRIT absolute rate-of-change-of-frequency (ROCOF) error (|RFE|) when multiple, strong interference tones are present.

FIG. 6A is a graphical representation of HM-ESPRIT total vector error (TVE) when multiple, strong interference tones are present. FIG. 6B is a graphical representation of HM-ESPRIT absolute frequency error (|FE|) when multiple, strong interference tones are present. FIG. 6C is a graphical representation of HM-ESPRIT absolute ROCOF error (|RFE|) when multiple, strong interference tones are present. HM-ESPRIT is able to correctly remove interference from all tones that are not the nominal system frequency, and is able to meet maximum error requirements for P-class steady state testing. These results rely on intelligently estimating the size of the signal subspace for both the ESPRIT frequency estimates and the modified-GTWLS synchrophasor estimate.

C. Python Testing Framework

Design of HM-ESPRIT was carried out using Python with scientific computing packages. The resulting library allows a user to prototype and test a synchrophasor algorithm on most IEEE defined test cases (for 50 or 60 fps requirements and tests) with support for both P-class and M-class error requirements. Synthetic data was created by integrating rate-of-change arrays of the derivatives of magnitude and frequency. These derivatives were integrated at a rate of $100 \times f_{sampling}$ and then downsampled to achieve the desired sampling rate. The library automatically tests a user's algorithm against a range of tests per category (e.g., steady state or modulated signals) and can summarize whether the algorithm passed or failed and display which test and error metrics failed.

III. Results

This section details the accuracy and performance of HM-ESPRIT on test cases defined in the 2018 PMU Standard. Error requirements and testing requirements are dependent on the reference signal frequency as well as the PMU reporting rate. The results in this section are for a reference signal frequency of 50 Hz, a frame reporting rate of 50 fps, and a data window of three cycles. A sampling rate of 8 kHz was used to ensure no aliasing occurred. AWGN was added to the synthetic data after downsampling. Multiple SNR cases were examined, by setting the noise variance of the AWGN based off of the 120 $V_{RMS}$ nominal RMS magnitude of the data according to:

$$SNR_{dB} = 10 \times \log_{10}(P_{signal}/P_{noise}) = \qquad \text{Equation 13}$$
$$10 \times \log_{10}(A_{RMS}^2/\sigma^2) \Rightarrow \sigma^2 = \frac{A_{RMS}^2}{10^{SNR_{dB}/10}}$$

A. Error Metrics Used to Evaluate PMUs

The 2018 PMU Standard specifies three major error metrics for evaluating PMUs: TVE, FE, and RFE. TVE is defined as:

$$TVE(n) = \sqrt{\frac{(\hat{X}_r(n) - X_r(n))^2 + (\hat{X}_i(n) - X_i(n))^2}{X_r^2(n) + X_i^2(n)}} \qquad \text{Equation 14}$$

where $\hat{X}_r(n)$ and $\hat{X}_i(n)$ represent the real and imaginary synchrophasor components of the nth frame and $X_r(n)$ and $X_i(n)$ are the real and imaginary components of the nth reference synchrophasor. Note that either incorrect magnitude, phase angle, or a combination of the two can cause TVE error to exceed the thresholds.

FE evaluates the accuracy of the frequency estimates:

$$FE(n) = f_{measured}(n) - f_{ref}(n) \qquad \text{Equation 15}$$

where $f_{ref}$ is the reference frequency value at the same time instant the estimate $f_{measured}$ is calculated.

Finally, RFE evaluates the accuracy of the ROCOF estimate:

$$RFE(n) = [df/dt]_{measured}(n) - [df/dt]_{ref}(n) \qquad \text{Equation 16}$$

where $[df/dt]_{ref}$ is the reference ROCOF value at the same time instant the ROCOF estimate, $[df/dt]_{measured}$, is calculated.

B. Steady State Compliance Tests

The 2018 PMU Standard requires multiple steady state tests; testing requirements are examined for reference signal frequency offset, harmonic distortion, and OOB interference.

Figure 7A:
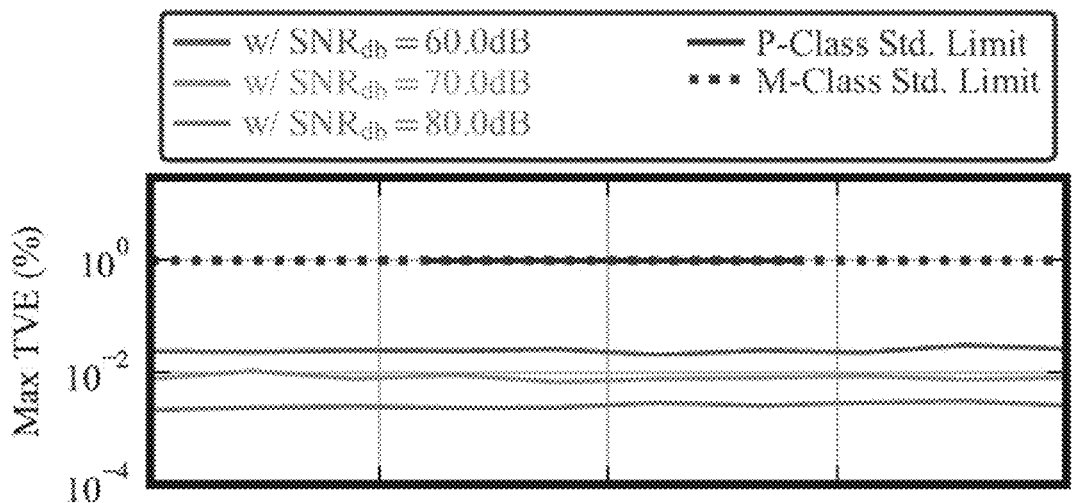
FIG. 7A is a graphical representation of HM-ESPRIT maximum TVE over a range of reference signal frequency conditions.
Figure 7B:
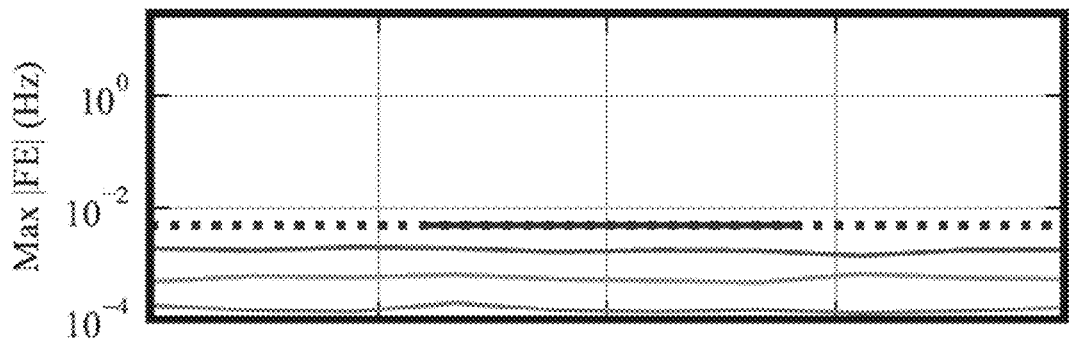
FIG. 7B is a graphical representation of HM-ESPRIT maximum |FE| over a range of reference signal frequency conditions.
Figure 7C:
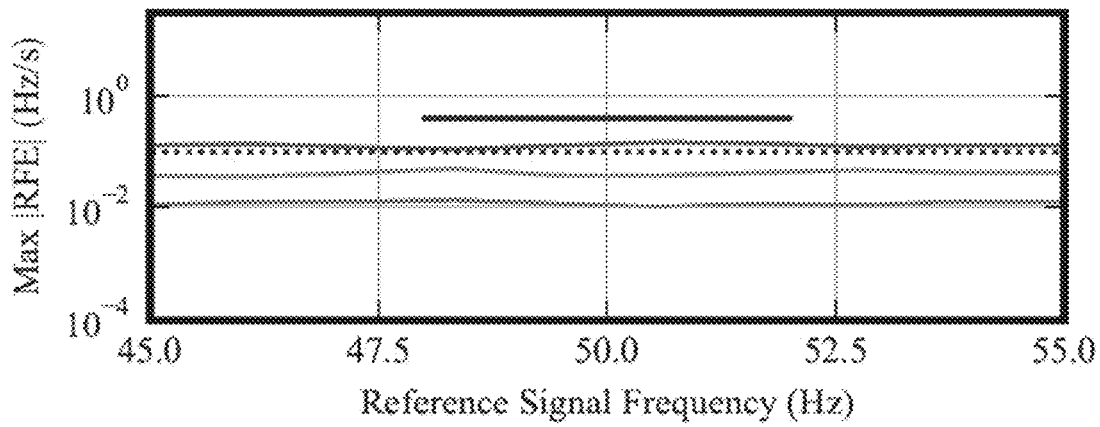
FIG. 7C is a graphical representation of HM-ESPRIT maximum |RFE| over a range of reference signal frequency conditions.

FIG. 7A is a graphical representation of HM-ESPRIT maximum TVE over a range of reference signal frequency conditions. FIG. 7B is a graphical representation of HM-ESPRIT maximum |FE| over a range of reference signal frequency conditions. FIG. 7C is a graphical representation of HM-ESPRIT maximum |RFE| over a range of reference signal frequency conditions. FIGS. 7A-7C show maximum estimation errors for steady state signals at various frequency offsets from nominal. Both P-class and M-class error limits are overlaid. The M-class tests require a ±5 Hz bandwidth, while the P-class tests only require ±2 Hz. The error profiles of the three error metrics are flat, indicating that HM-ESPRIT is able to accurately produce PMU frames at a variety of frequencies, even when an integer number of samples per cycle is not observed. For SNRs of 70 dB and 80 dB, HM-ESPRIT is able to accurately estimate synchrophasors, frequency, and ROCOF and meet both P- and M-class error requirements. However, when the SNR reaches 60 dB, only ROCOF error requirements for the M-class tests are not met.

Figure 8A:
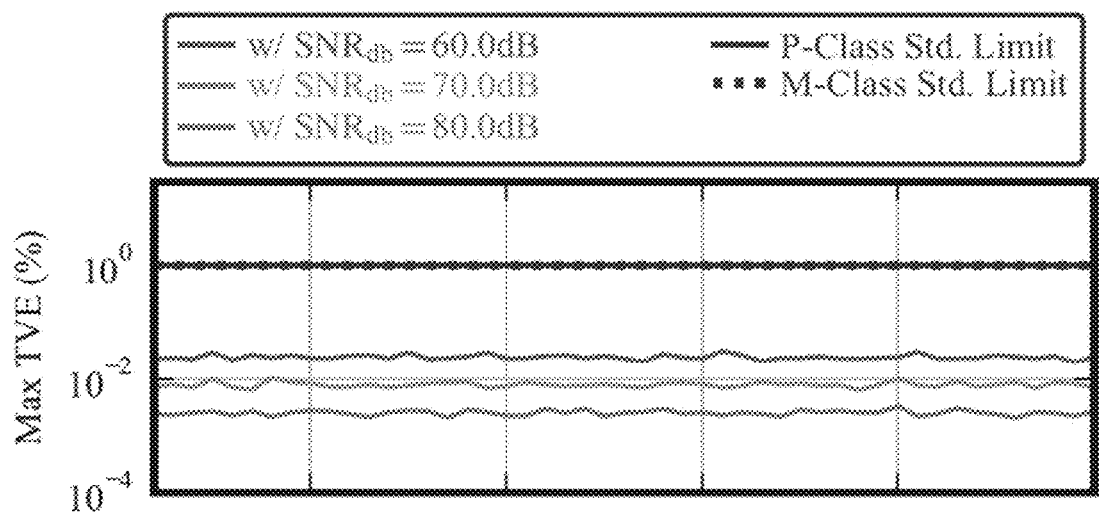
FIG. 8A is a graphical representation of HM-ESPRIT maximum TVE during harmonic distortion testing.
Figure 8B:
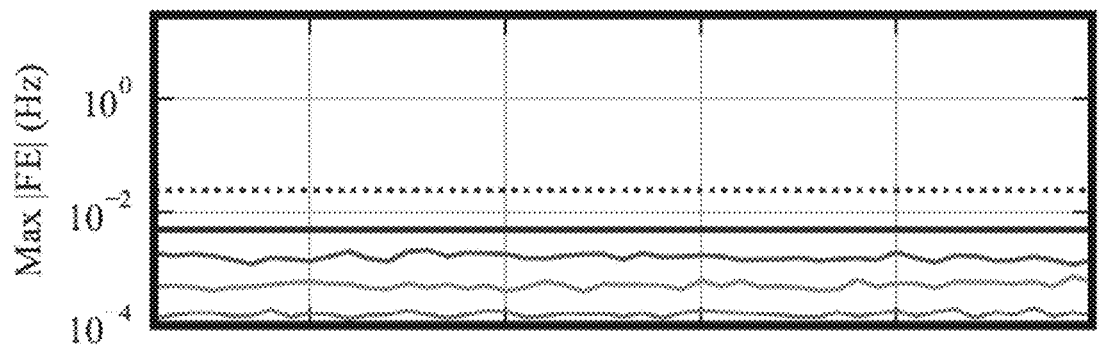
FIG. 8B is a graphical representation of HM-ESPRIT maximum |FE| during harmonic distortion testing.
Figure 8C:
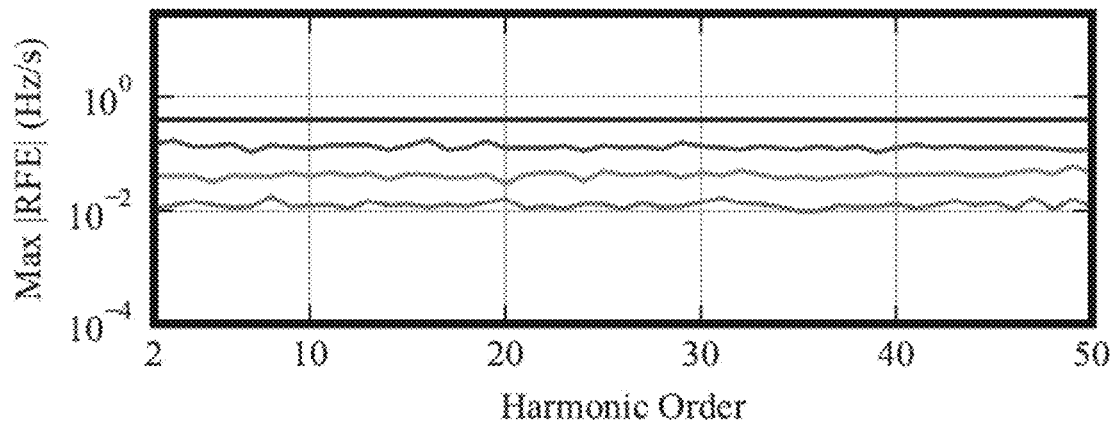
FIG. 8C is a graphical representation of HM-ESPRIT maximum |RFE| during harmonic distortion testing.

FIG. 8A is a graphical representation of HM-ESPRIT maximum TVE during harmonic distortion testing. FIG. 8B is a graphical representation of HM-ESPRIT maximum |FE| during harmonic distortion testing. FIG. 8C is a graphical representation of HM-ESPRIT maximum |RFE| during harmonic distortion testing. For this test, M-class testing requirements were used (i.e., the magnitude of the harmonic signal magnitude was equal to 10% of the reference signal magnitude). While the P-class tests only require a harmonic power equal to 1% of the reference signal, the maximum error limits for the P-class requirements are included as well.

Similar to the results in FIGS. 7A-7C and FIG. 9A-9C, HM-ESPRIT exhibits flat error profiles regardless of interfering harmonic. Despite using the M-class testing conditions, HM-ESPRIT is able to meet the P-class requirements as well, which are stricter than the M-class requirements for the case of harmonic distortion. This is attributable to HM-ESPRIT's ability to effectively separate out interference from any other tone (as long as the heuristic of 20 Hz separation is observed). Under the requirements for harmonic distortion, HM-ESPRIT is able to meet both P- and M-class maximum error requirements for an SNR ranging from 60 dB to 80 dB.

Figure 9A:
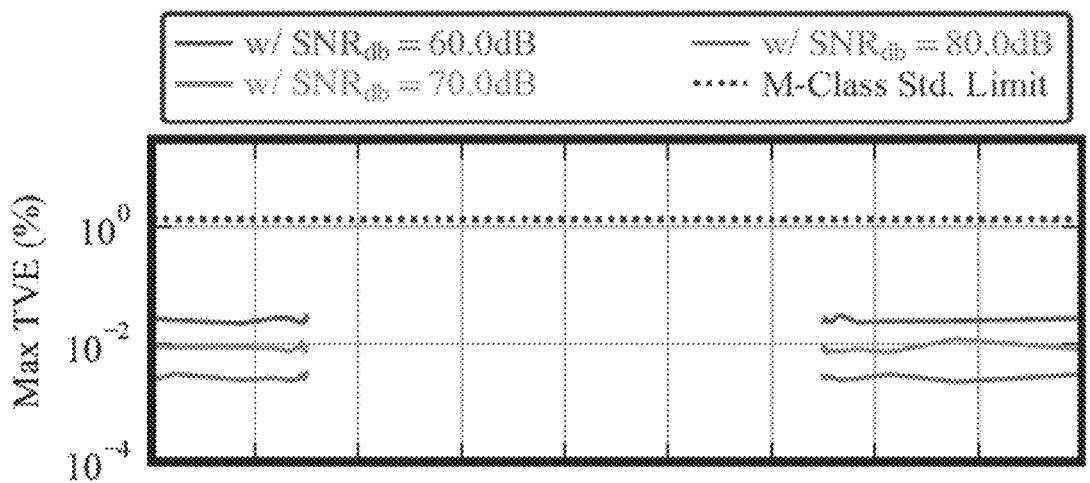
FIG. 9A is a graphical representation of HM-ESPRIT maximum TVE during OOB interference testing.
Figure 9B:
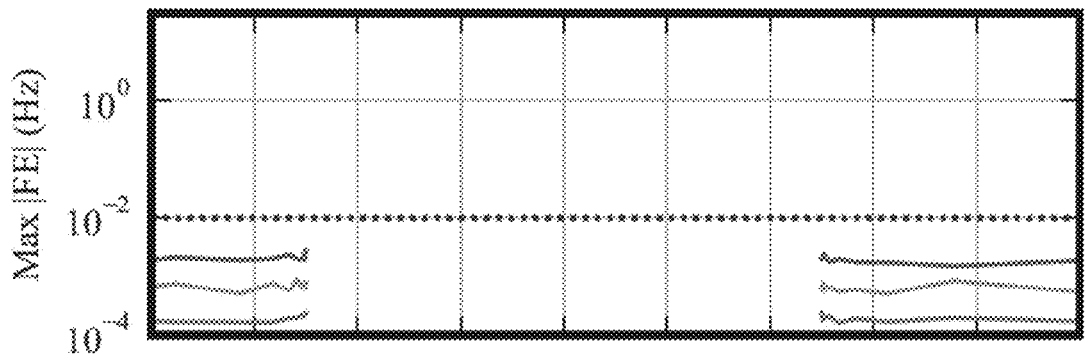
FIG. 9B is a graphical representation of HM-ESPRIT maximum |FE| during OOB interference testing.
Figure 9C:
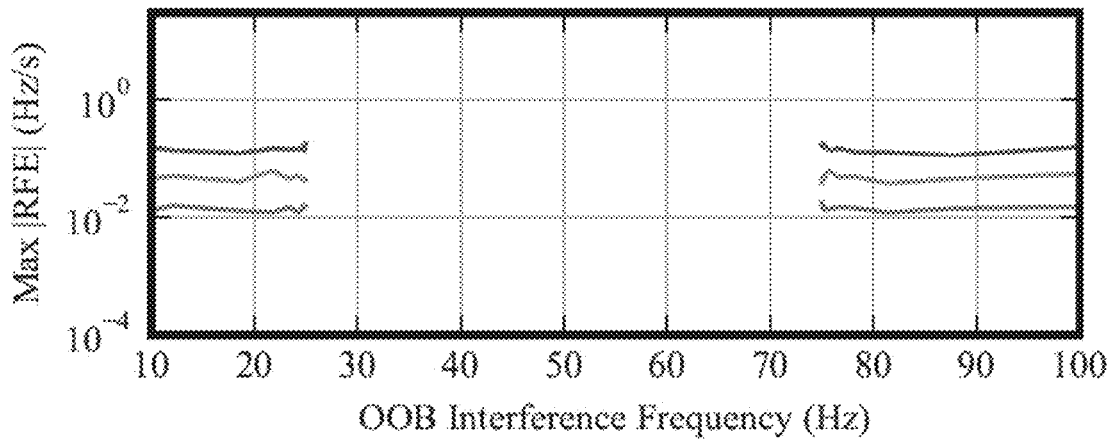
FIG. 9C is a graphical representation of HM-ESPRIT maximum |RFE| during OOB interference testing.

FIG. 9A is a graphical representation of HM-ESPRIT maximum TVE during OOB interference testing. FIG. 9B is a graphical representation of HM-ESPRIT maximum |FE| during OOB interference testing. FIG. 9C is a graphical representation of HM-ESPRIT maximum |RFE| during OOB interference testing. HM-ESPRIT responds nearly identically to the harmonic distortion and signal frequency testing. Since the OOB interference frequency is 22.5 Hz separated from the fundamental (i.e., the closest an interfering signal could be is 25 Hz–47.5 Hz=22.5 Hz), the OOB frequency is captured during the ESPRIT frequency estimation stage and included the modified GTWLS estimate of complex phasors. Note that the 2018 PMU Standard does not specify a maximum |ROCOF| error limit, but ROCOF error is provided for informational purposes. While results are reported as a function of the interfering frequency, the maximum of each error is taken over a sweep of the reference frequency in the range required by the 2018 PMU Standard. For the case of a nominal frequency of 50 Hz and a reporting rate of 50 fps, the reference frequency is swept from 47.5 Hz to 52.5 Hz.

The steady state results show how well the harmonic mean threshold method works across various SNRs. Under the requirements in the 2018 PMU Standard, HM-ESPRIT shows near constant error profiles across harmonic distortion, OOB, and signal frequency tests. The largest factor in the accuracy of HM-ESPRIT is the SNR during a given test rather than the frequency of the reference signal or the frequency and power of an interfering signal.

C. Dynamic Compliance Tests

The 2018 PMU Standard requires a variety of dynamic signal testing including magnitude modulation, phase modulation, and a ramp in the reference signal frequency. The M-class testing requirements are again used, which require a sweep of the tested parameter's modulation frequency from at least 0.2 Hz up to 5 Hz (for both magnitude and phase tests).

Figure 10A:
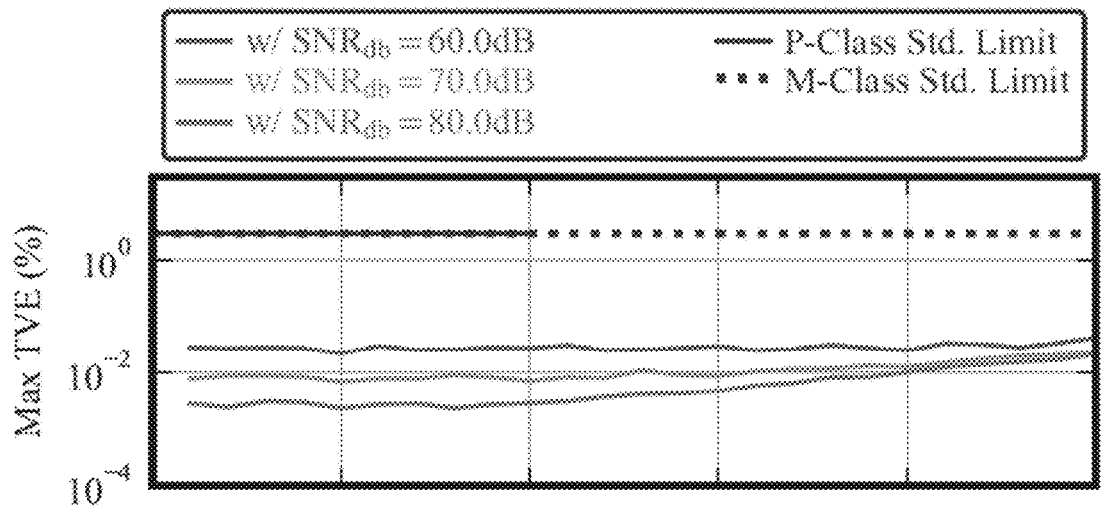
FIG. 10A is a graphical representation of HM-ESPRIT maximum TVE during magnitude modulation testing.
Figure 10B:
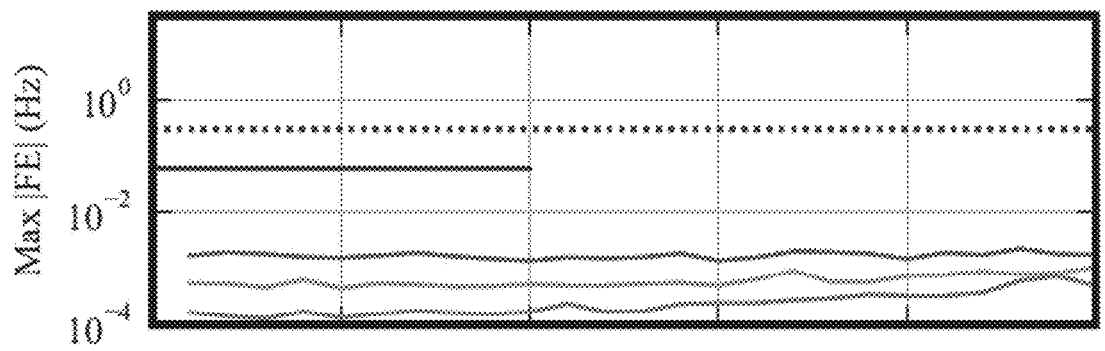
FIG. 10B is a graphical representation of HM-ESPRIT maximum |FE| during magnitude modulation testing.
Figure 10C:
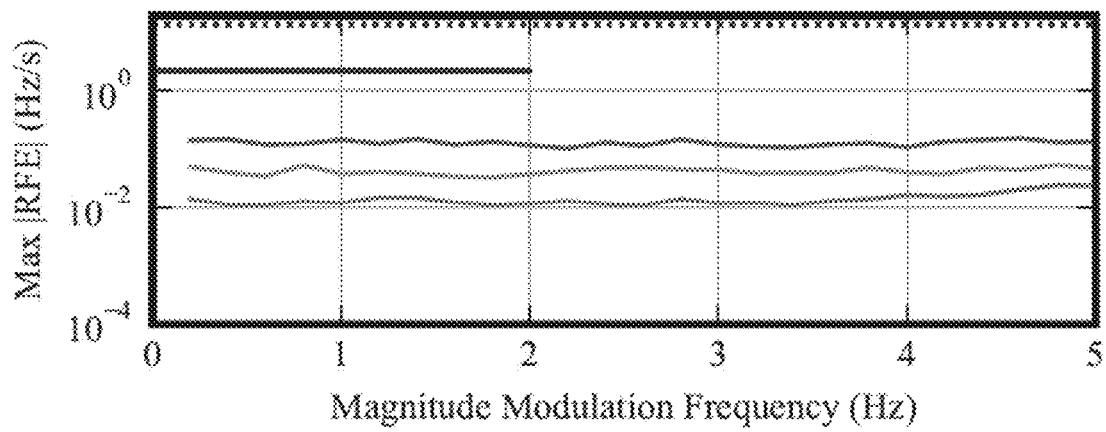
FIG. 10C is a graphical representation of HM-ESPRIT maximum |RFE| during magnitude modulation testing.

FIG. 10A is a graphical representation of HM-ESPRIT maximum TVE during magnitude modulation testing. FIG. 10B is a graphical representation of HM-ESPRIT maximum |FE| during magnitude modulation testing. FIG. 10C is a graphical representation of HM-ESPRIT maximum |RFE| during magnitude modulation testing. Using the dynamic signal model in the modified GTWLS method results in flat maximum error profiles for magnitude modulation frequencies up to 2 Hz. Around the 2 Hz mark, maximum TVE starts increasing for the 80 dB case while maximum |FE| and |RFE| start to increase around the 3 Hz mark (for the case of 80 dB SNR). HM-ESPRIT meets both the P- and M-class requirements for all error metrics.

Figure 11A:
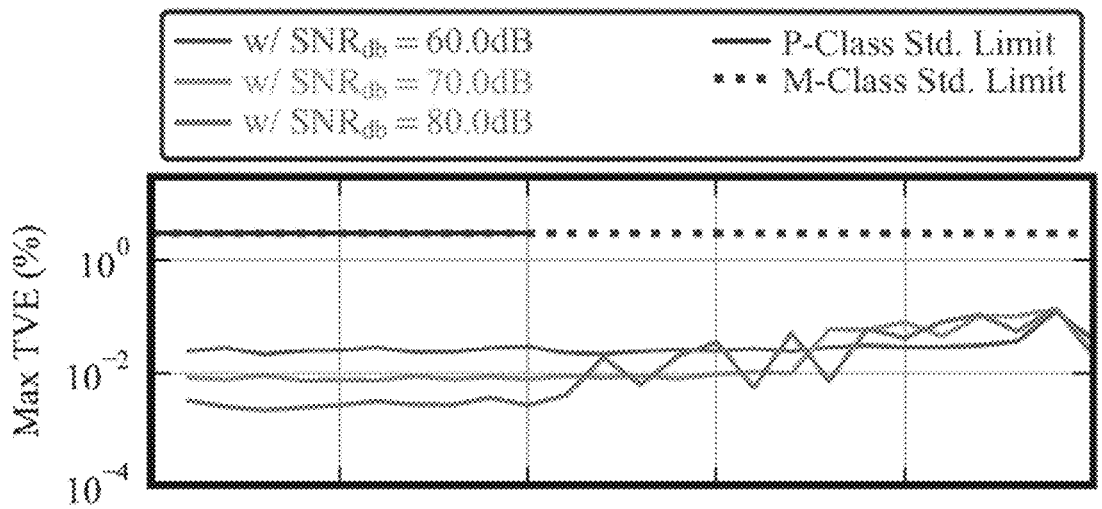
FIG. 11A is a graphical representation of HM-ESPRIT maximum TVE during phase modulation testing.
Figure 11B:
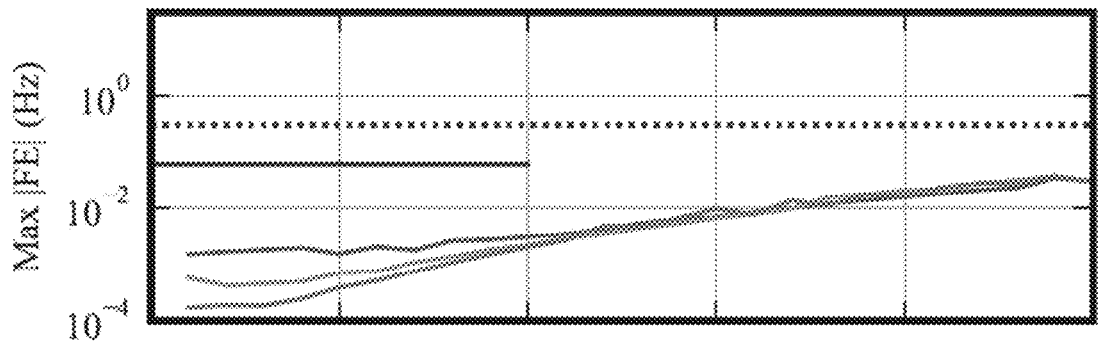
FIG. 11B is a graphical representation of HM-ESPRIT maximum |FE| during phase modulation testing.
Figure 11C:
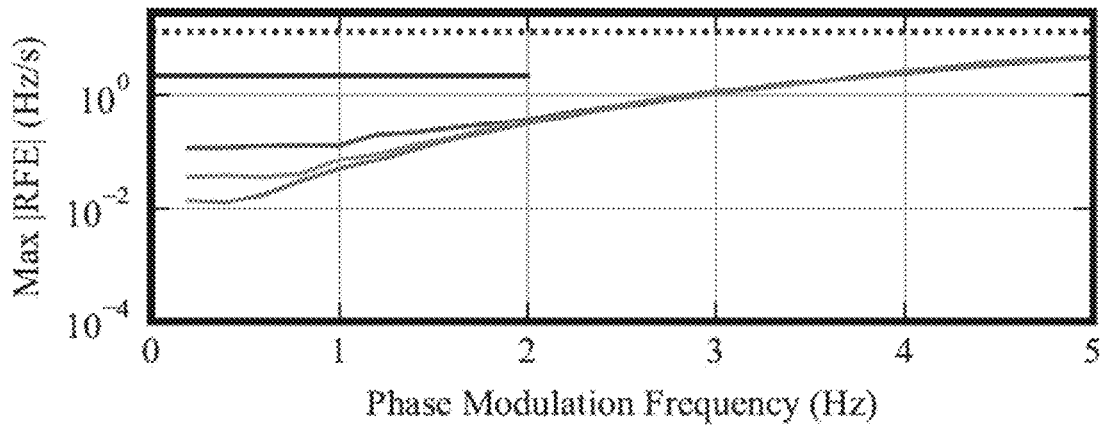
FIG. 11C is a graphical representation of HM-ESPRIT maximum |RFE| during phase modulation testing.

FIG. 11A is a graphical representation of HM-ESPRIT maximum TVE during phase modulation testing. FIG. 11B is a graphical representation of HM-ESPRIT maximum |FE| during phase modulation testing. FIG. 11C is a graphical representation of HM-ESPRIT maximum |RFE| during phase modulation testing. Recall that frequency estimates produced by ESPRIT are adjusted with the FD calculation from Belega and that ROCOF estimates are simply the finite difference between two frequency estimates. The effect of the stationary signal assumption from Equation 3 can be seen in the maximum |FE| and |RFE| plots. As the phase modulation frequency increases, the error in the ESPRIT frequency estimate increases despite the adjustment from the FD calculation. This in turn leads to an increase in maximum |RFE| due to the reliance of the ROCOF estimate on the frequency estimate. Despite this, HM-ESPRIT is able to meet both P- and M-class maximum error requirements over the respective modulation frequency testing ranges required by the 2018 PMU Standard.

The final dynamic signal test is a linear reference frequency ramp. Both positive (shown) and negative frequency ramps are required; the results for both are similar.

Figure 12A:
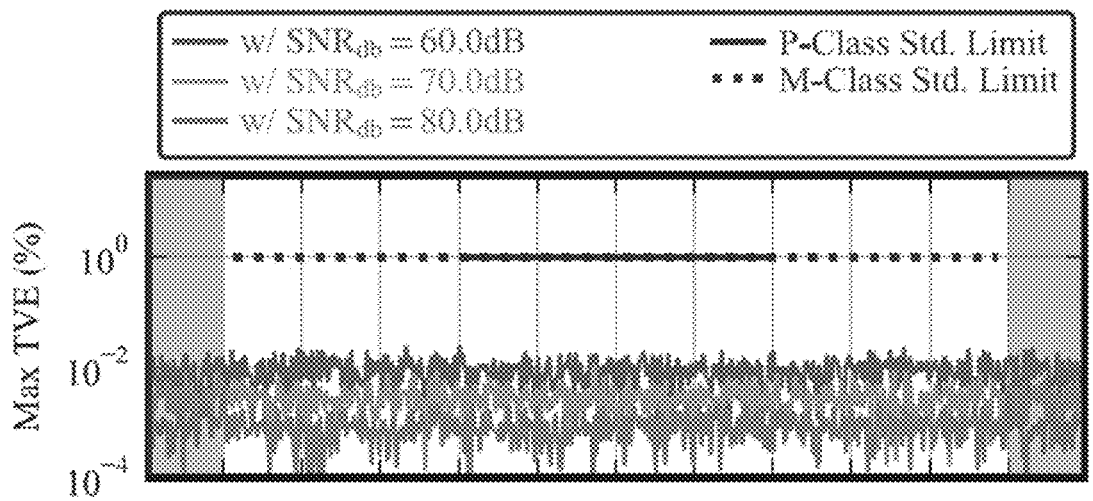
FIG. 12A is a graphical representation of HM-ESPRIT maximum TVE during a frequency ramp from 45 Hz to 55 Hz at a rate of 1 Hz/s.
Figure 12B:
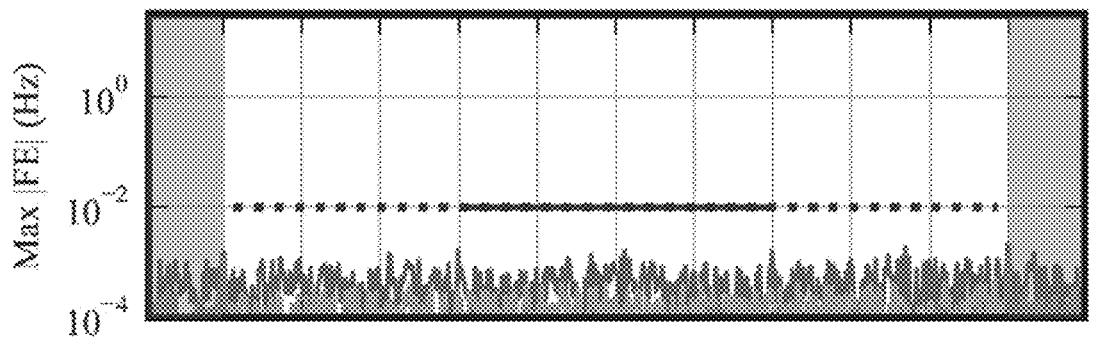
FIG. 12B is a graphical representation of HM-ESPRIT maximum 51 |FE| during a frequency ramp from 45 Hz to 55 Hz at a rate of 1 Hz/s.
Figure 12C:
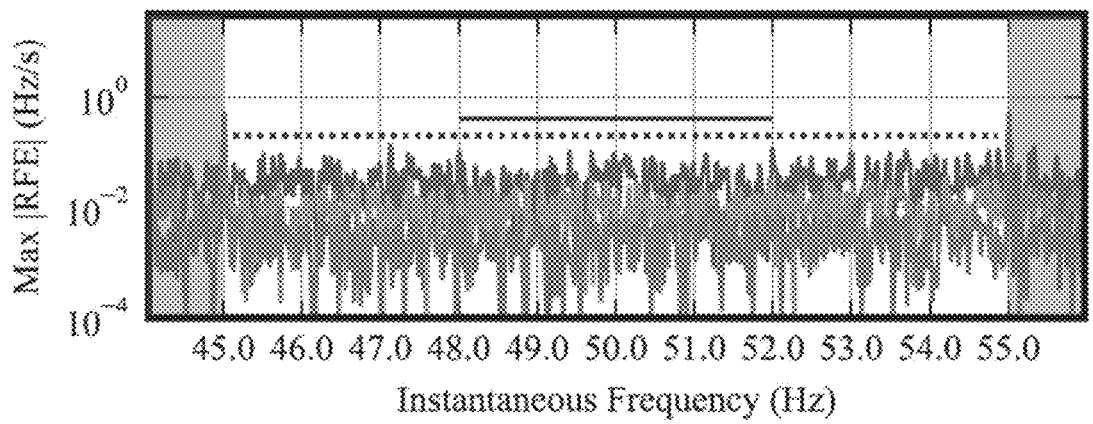
FIG. 12C is a graphical representation of HM-ESPRIT maximum |RFE| during a frequency ramp from 45 Hz to 55 Hz at a rate of 1 Hz/s.

FIG. 12A is a graphical representation of HM-ESPRIT maximum TVE during a frequency ramp from 45 Hz to 55 Hz at a rate of 1 Hz/s. FIG. 12B is a graphical representation of HM-ESPRIT maximum |FE| during a frequency ramp from 45 Hz to 55 Hz at a rate of 1 Hz/s. FIG. 12C is a graphical representation of HM-ESPRIT maximum |RFE| during a frequency ramp from 45 Hz to 55 Hz at a rate of 1 Hz/s. Both P- and M-class maximum error requirements are shown. The gray areas correspond to the steady state starting and ending conditions of the frequency ramp test and are not included in the evaluation.

FIGS. 11A-11C and FIGS. 12A-12C illustrate an interesting property of ESPRIT frequency estimation during dynamic conditions. The frequency estimates produced by the ESPRIT algorithm (after subspace reduction using the proposed method) tend to be an average of the instantaneous frequencies observed in a data window. In the case of phase modulation, at the peaks and troughs of frequency variation, ESPRIT underestimates or overestimates frequency, respectively. This leads to larger frequency estimation errors during phase modulation.

However, the frequency variation during a frequency ramp is linear. The average of instantaneous frequencies in the window is equal to the instantaneous frequency at the center. Since estimates are evaluated at the center of a data window, the frequency estimates are incredibly accurate, despite the stationary assumption in ESPRIT. This is seen in the flat maximum |FE| (and by extension a flat maximum |RFE|) in FIGS. 12A-12C. The use of the modified GTWLS lends to a flat maximum TVE during this test as well. The result is that HM-ESPRIT meets both P- and M-class maximum error requirements during a linear ramp of the reference frequency for SNRs ranging from 60 dB to 80 dB.

D. Stepped Parameter Compliance Tests

The final test category is parameter steps. Positive (shown) and negative steps are required for both the magnitude and phase parameter; the negative step results are similar.

Figure 13A:
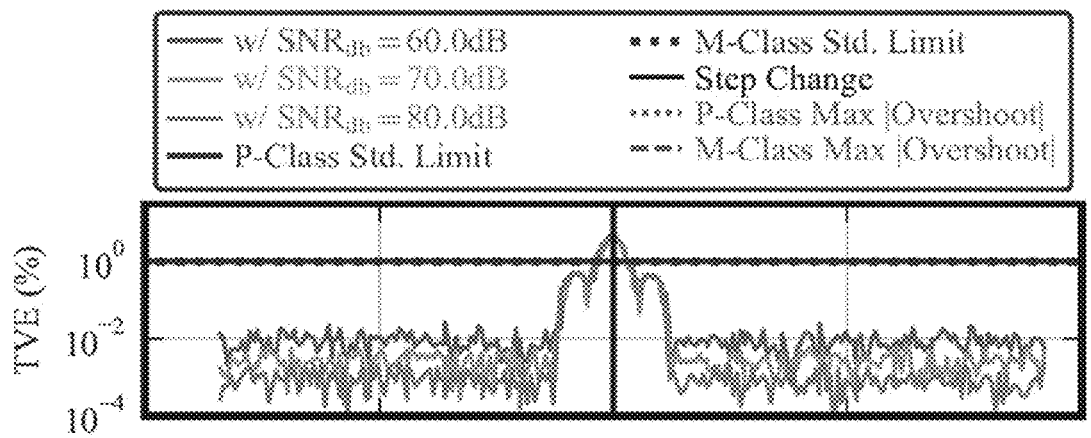
FIG. 13A is a graphical representation of HM-ESPRIT maximum TVE during magnitude step testing.
Figure 13B:
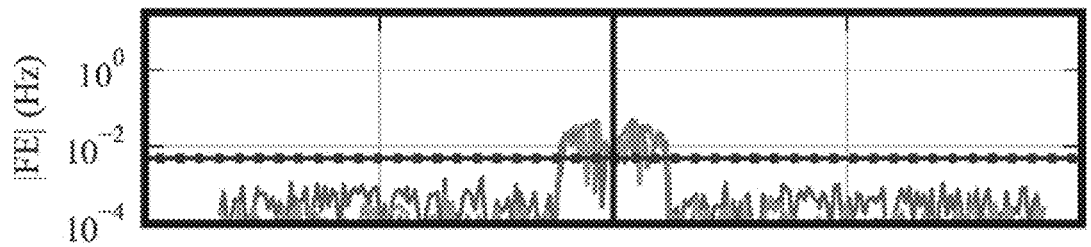
FIG. 13B is a graphical representation of HM-ESPRIT maximum |FE| during magnitude step testing.
Figure 13C:
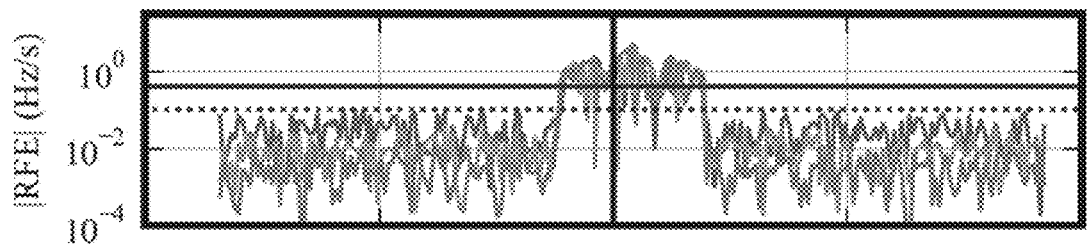
FIG. 13C is a graphical representation of HM-ESPRIT maximum |RFE| during magnitude step testing.
Figure 13D:
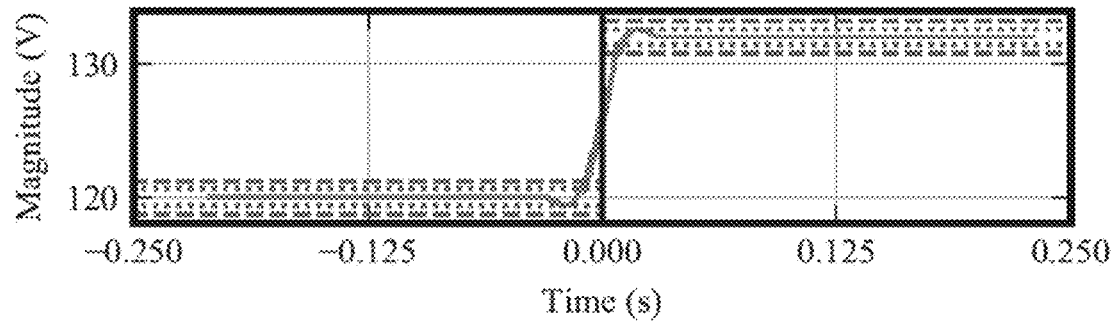
FIG. 13D is a graphical representation of the magnitude estimate produced by the proposed algorithm.

FIG. 13A is a graphical representation of HM-ESPRIT maximum TVE during magnitude step testing. FIG. 13B is a graphical representation of HM-ESPRIT maximum |FE| during magnitude step testing. FIG. 13C is a graphical representation of HM-ESPRIT maximum |RFE| during magnitude step testing. FIG. 13D is a graphical representation of the magnitude estimate produced by the proposed algorithm.

Figure 14A:
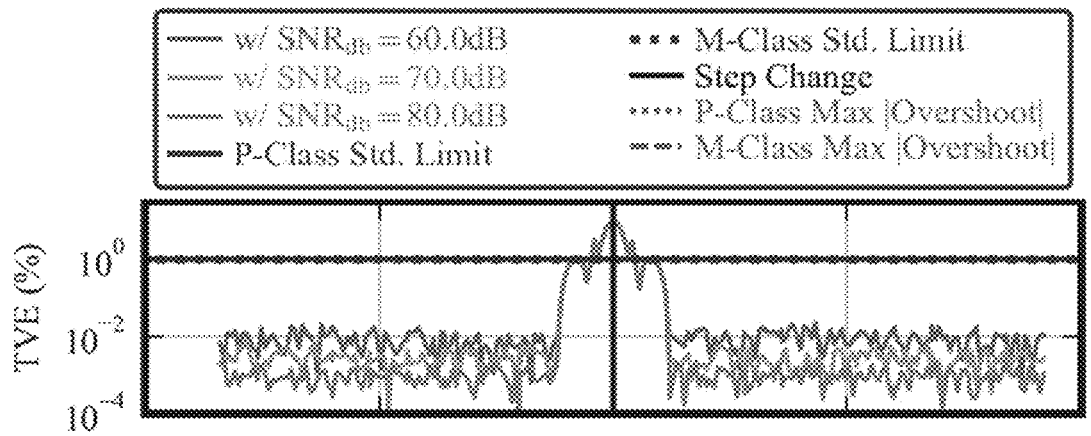
FIG. 14A is a graphical representation of HM-ESPRIT maximum TVE during phase step testing.
Figure 14B:
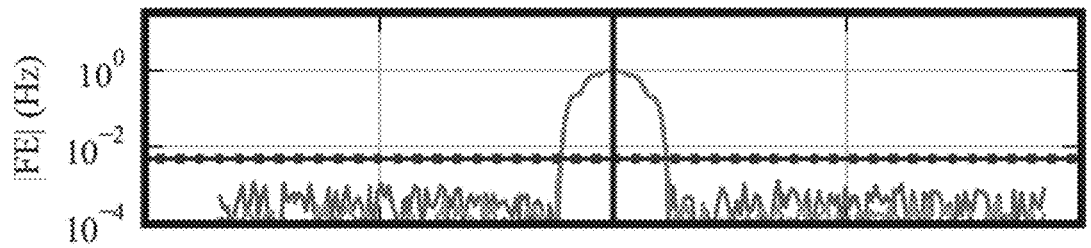
FIG. 14B is a graphical representation of HM-ESPRIT maximum |FE| during phase step testing.
Figure 14C:
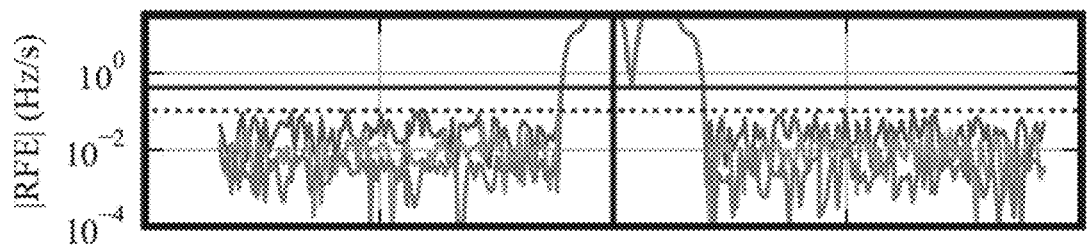
FIG. 14C is a graphical representation of HM-ESPRIT maximum |RFE| during phase step testing.
Figure 14D:
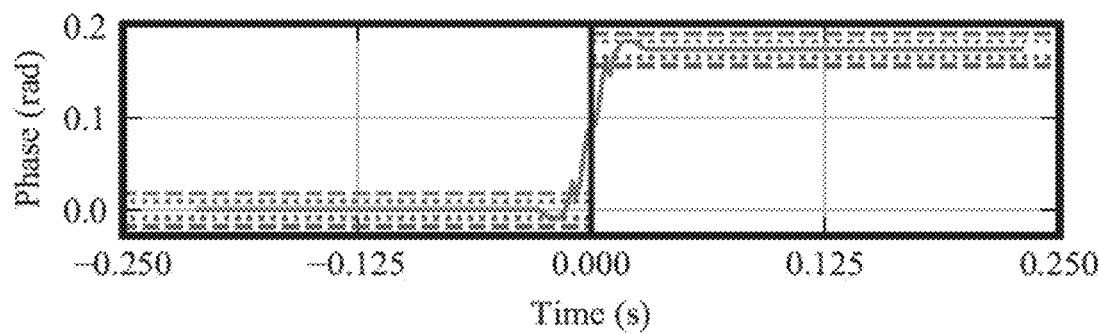
FIG. 14D is a graphical representation of the phase estimate produced by the proposed algorithm.

FIG. 14A is a graphical representation of HM-ESPRIT maximum TVE during phase step testing. FIG. 14B is a graphical representation of HM-ESPRIT maximum |FE| during phase step testing. FIG. 14C is a graphical representation of HM-ESPRIT maximum |RFE| during phase step testing. FIG. 14D is a graphical representation of the phase estimate produced by the proposed algorithm.

The plots of FIGS. 13A-13D and 14A-14D were generated in accordance with IEC/IEEE 60255-118-1 Annex C.4 where the location of the step is varied over 11 time points in a time window of 0.02 s (for the case of 50 fps). The 11 different step tests are then aligned in time and the TVE, |FE|, |RFE|, and parameter estimates for all 11 tests are interleaved. This achieves the effect of super-sampling in the time domain. For step-based tests, a PMU algorithm is evaluated in terms of the TVE, |FE|, and |RFE| response times as well as the delay time and maximum overshoot. These values can be seen in Table I for the 60 dB and 80 dB SNR cases. The overshoot/undershoot of the parameter estimates is an artifact of the modified GTWLS method; a simple LS estimate of the synchrophasor does not produce the overshoot/undershoot. However, the additional benefit provided by the modified GTWLS method used during other dynamic tests is worthwhile and is therefore still used.

TABLE I

Comparison of Maximum Errors with the i-IpDFT as Well as the 2018 PMU Standard P- and M-Class Maximum Error Limits

| Test Case | | Max Error Limit | | i-IpDFT | | | | HM-ESPRIT | |
|---|---|---|---|---|---|---|---|---|---|
| | | | | cos window | | Hann window | | | |
| | | P-Class | M-Class | 60 dB | 80 dB | 60 dB | 80 dB | 60 dB | 80 dB |
| Signal Frequency | Max TVE (%) | 1 | 1 | 0.024 | *0.02* | 0.030 | 0.003 | 0.031 | 0.003 |
| | Max |FE| (mHz) | 5 | 5 | 1.300 | *0.100* | 1.500 | *0.100* | 2.551 | 0.187 |
| | Max |RFE| (Hz/s) | 0.4 | 0.1 | 0.095 | *0.009* | 0.126 | 0.012 | 0.148 | 0.023 |
| Harmonic Distortion | Max TVE (%) | 1 | 1 | 0.055 | 0.047 | 0.026 | *0.003* | 0.037 | 0.004 |
| | Max |FE| (mHz) | 5 | 25 | 2.000 | 1.100 | 1.200 | *0.100* | 3.021 | 0.198 |
| | Max |RFE| (Hz/s) | 0.4 | N/A | 0.085 | *0.009* | 0.124 | 0.011 | 0.280 | 0.028 |
| Out-of-Band Interference 47.5 Hz ≤ $f_0$ ≤ 52.5 Hz | Max TVE (%) | N/A | 1.3 | 0.056 | 0.022 | 0.108 | 0.082 | 0.036 | *0.003* |
| | Max |FE| (mHz) | N/A | 10 | 2.700 | 1.100 | 5.600 | 4.100 | 3.298 | *0.273* |
| | Max |RFE| (Hz/s) | N/A | N/A | 0.217 | 0.101 | 0.513 | 0.369 | 0.259 | *0.028* |
| Frequency Ramp (±5 Hz; 1 Hz/s) | Max TVE (%) | 1 | 1 | 0.058 | 0.055 | 0.044 | 0.038 | 0.029 | *0.003* |
| | Max |FE| (mHz) | 10 | 10 | 1.000 | *0.200* | 0.900 | *0.200* | 2.490 | 0.201 |
| | Max |RFE| (Hz/s) | 0.4 | 0.2 | 0.088 | *0.011* | 0.083 | *0.011* | 0.282 | 0.025 |
| Magnitude Modulation (Max 5 Hz) | Max TVE (%) | 3 | 3 | 0.846 | 0.847 | 0.604 | 0.604 | 0.041 | *0.021* |
| | Max |FE| (mHz) | 60 | 300 | 2.200 | 1.600 | 1.600 | *0.400* | 3.477 | 0.692 |
| | Max |RFE| (Hz/s) | 2.3 | 14 | 0.106 | 0.051 | 0.123 | *0.016* | 0.154 | 0.024 |
| Phase Modulation (Max 5 Hz) | Max TVE (%) | 3 | 3 | 0.805 | 0.806 | 0.547 | 0.547 | 0.036 | *0.139* |
| | Max |FE| (mHz) | 60 | 300 | 21.900 | 22.000 | 17.900 | *17.400* | 22.678 | 36.240 |
| | Max |RFE| (Hz/s) | 2.3 | 14 | 0.106 | 0.051 | 0.123 | *0.016* | 0.154 | 0.024 |

TABLE I-continued

Comparison of Maximum Errors with the i-IpDFT as Well as
the 2018 PMU Standard P- and M-Class Maximum Error Limits

| | | Max Error Limit | | i-IpDFT | | | | HM-ESPRIT | |
| | | P- | M- | cos window | | Hann window | | | |
| Test Case | | Class | Class | 60 dB | 80 dB | 60 dB | 80 dB | 60 dB | 80 dB |
|---|---|---|---|---|---|---|---|---|---|
| Magnitude Step | TVE Response Time (s) | 0.04 | 0.14 | 0.034 | 0.034 | 0.028 | 0.028 | 0.018 | *0.018* |
| | FE Response Time (s) | 0.09 | 0.28 | 0.048 | 0.048 | 0.044 | *0.044* | 0.057 | 0.055 |
| | RFE Response Time (s) | 0.12 | 0.28 | 0.056 | 0.056 | 0.054 | *0.054* | 0.079 | 0.076 |
| | \|Delay Time\| (s) | 0.005 | 0.005 | 0.002 | 0.002 | 0.002 | 0.002 | 0.001 | *0.001* |
| | Max Overshoot (%) | 5 | 10 | 0.000 | *0.000* | 0.000 | *0.000* | 4.758 | 4.875 |
| Phase Step | TVE Response Time (s) | 0.04 | 0.14 | 0.040 | 0.040 | 0.032 | 0.032 | 0.023 | *0.023* |
| | FE Response Time (s) | 0.09 | 0.28 | 0.048 | 0.048 | 0.044 | *0.044* | 0.057 | 0.056 |
| | RFE Response Time (s) | 0.12 | 0.28 | 0.054 | *0.054* | 0.054 | *0.054* | 0.079 | 0.077 |
| | \|Delay Time\| (s) | 0.005 | 0.005 | 0.002 | 0.002 | 0.002 | 0.002 | 0.001 | *0.001* |
| | Max Overshoot (%) | 5 | 10 | 0.000 | *0.000* | 0.000 | *0.000* | 5.271 | 5.271 |

E. Comparison with State-of-the-Art

A comparison with the iterative interpolated discrete Fourier transform (i-IpDFT) detailed in Derviškadićis presented in Table I. Both the proposed algorithm and the i-IpDFT use a three-cycle data window, a nominal system frequency of 50 Hz, and a frame reporting rate of 50 fps. The results from Derviškadićare presented as reported along with the results for HM-ESPRIT. The results in Table I were made with the M-class testing requirements in the 2018 PMU Standard, but both the P- and M-class maximum error requirements are included for each test. The only difference in the testing of each algorithm is the sampling rate used; a 50 kHz sampling rate was used for the i-IpDFT algorithm, while HM-ESPRIT testing used a sampling rate of 8 kHz.

Instances where algorithms do not meet the 2018 PMU Standard maximum error requirements are highlighted. The lowest estimation errors for the case of an SNR of 60 dB are bolded, while the lowest estimation errors for the case of an SNR of 80 dB are bolded and italicized. From the table it is shown that the i-IpDFT only fails one test (when using a Hanning window): the M-class maximum |RFE| requirement for the signal frequency offset test. HM-ESPRIT also fails the M-class maximum |RFE| requirement for the same test, and also fails the P-class maximum overshoot requirement for the phase step test. However, at sampling rates above 16 kHz, HM-ESPRIT accuracy improves and is able to pass the M-class signal frequency offset tests at an SNR of 60 dB. Increasing the sampling rate does not improve the overshoot during the magnitude or phase step tests.

HM-ESPRIT outperforms the i-IpDFT algorithm in terms of TVE for the OOB interference, frequency ramp, magnitude modulation, and phase modulation tests for SNRs of both 60 dB and 80 dB. For an SNR of 80 dB, HM-ESPRIT outperforms the i-IpDFT algorithm in terms of |FE| and |RFE| for the OOB interference test as well. Performances during the step-based tests are similar, with the exception of overshoot where the i-IpDFT shows no overshoot.

F. Computational Complexity

Synchrophasor algorithms need to provide estimates at a rate up to twice the nominal system frequency; within 10 ms for a 50 Hz system (8 ms for 60 Hz systems). The other contributions of this disclosure include showing that computation of the ESPRIT frequency estimates can be greatly improved by switching from the use of the SVD to the EVD, and that the proposed algorithm can run on low size, weight, and power (SWaP) systems. Table II shows the average, standard deviation, and maximum time to compute a PMU frame on two prototypical systems. The first is a desktop PC with a 4 GHz Intel i7 processor and 16 GB of RAM and the second is a Raspberry Pi 4 with a 1.5 GHz, 4-core ARM processor and 4 GB of RAM. For the desktop PC system, the computational time of the traditional SVD is compared with the optimized EVD. When considering the computational complexity, the LS frequency estimates used in ESPRIT and to estimate synchrophasors are $O(n^3)$. For small sample windows, the computational complexity is dominated by the decomposition of the autocorrelation matrix. This means the switch from SVD ($O(n^3)$) to EVD ($O(n^2)$) has a large impact on the overall speed of the algorithm. From the table it is shown that frame computation times are 1.94 times faster when using the EVD compared to the SVD.

TABLE II

Mean, Standard Deviation, and Maximum Computation Times to Produce a PMU Frame with HM-ESPRIT

| Computation Time | Runtime On Modern PC (ms) | | Runtime On Raspberry Pi 4 (ms) | | |
|---|---|---|---|---|---|
| | w/ SVD $f_s$ = 8 kHz | w/ EVD $f_s$ = 8 kHz | w/ EVD $f_s$ = 1 kHz | w/ EVD $f_s$ = 2 kHz | w/ EVD $f_s$ = 4 kHz |
| mean (ms) | 3.81 | 1.96 | 2.44 | 3.65 | 7.94 |
| std (ms) | 0.22 | 0.2 | 0.21 | 0.23 | 0.29 |
| max (ms) | 7.86 | 3.18 | 4.7 | 5.18 | 17.58 |

Figure 15A:
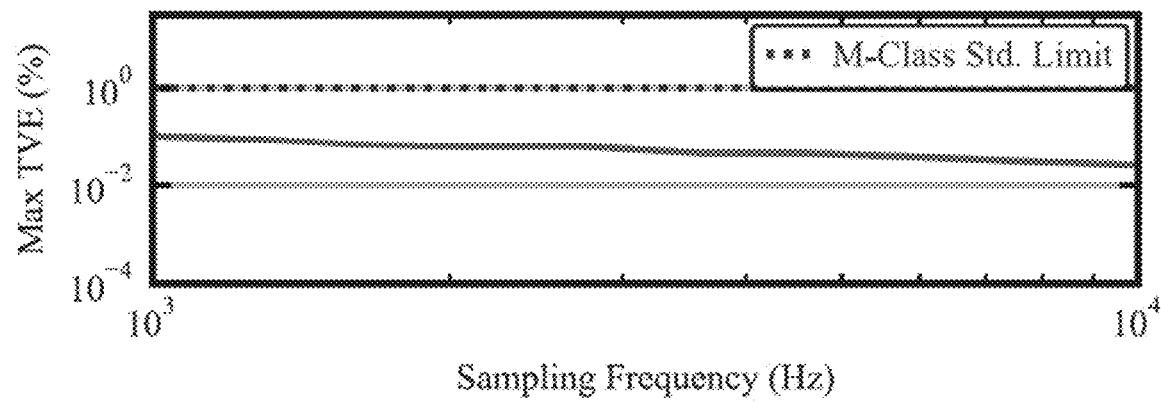
FIG. 15A is a graphical representation of HM-ESPRIT maximum TVE over all OOB interference tests.
Figure 15B:
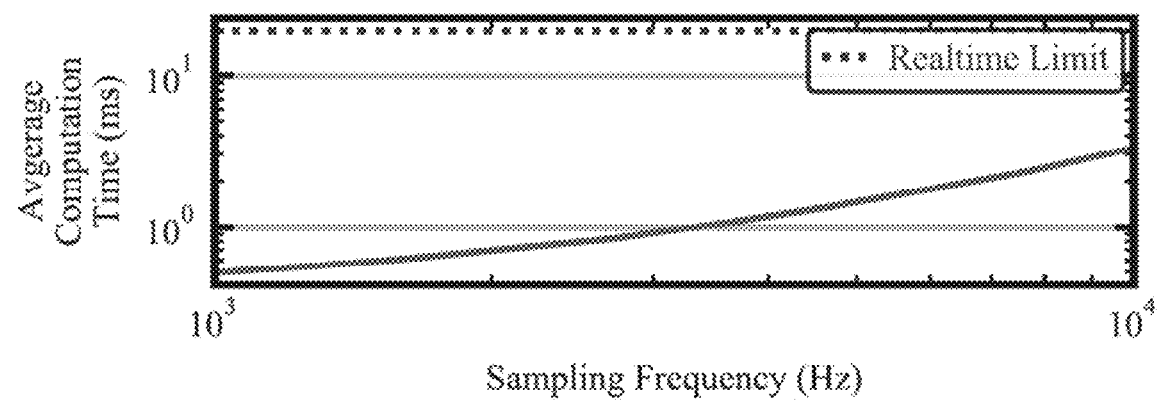
FIG. 15B is a graphical representation of average computation time to calculate a PMU frame as a function of sampling rate.

FIG. 15A is a graphical representation of HM-ESPRIT maximum TVE over all OOB interference tests. FIG. 15B is a graphical representation of average computation time to calculate a PMU frame as a function of sampling rate. As mentioned above, the sampling rate used with HM-ESPRIT can affect the estimation accuracy as well as the computation time. The maximum TVE shown in FIG. 15A is calculated by taking the maximum TVE over every test (i.e., every combination of interference frequency and reference frequency).

FIG. 15B shows the relation between the average computation time (on a modern PC) and sampling rate. These tests show a tradeoff between maximum TVE and computation time as the sampling rate is increased. At a sampling rate of 4 kHz, error profiles for the various PMU tests are similar to those seen in FIGS. 7A-14D though aliasing does occur during the harmonic distortion tests when the sampling rate is sufficiently low.

Real-time performance is possible on the Raspberry Pi 4. Computation times for sampling rates of 1 kHz, 2 kHz, and 4 kHz are shown in Table II of HM-ESPRIT, implemented with the optimized EVD. For these sampling rates, average estimation time is within the real-time reporting limit. However, the maximum time increases up to 17.58 ms. This means that a few estimates are delayed, but on average most estimates will be on time. To improve performance, the algorithm could be ported to C or ported to an FPGA.

IV. Computer System

Figure 16:
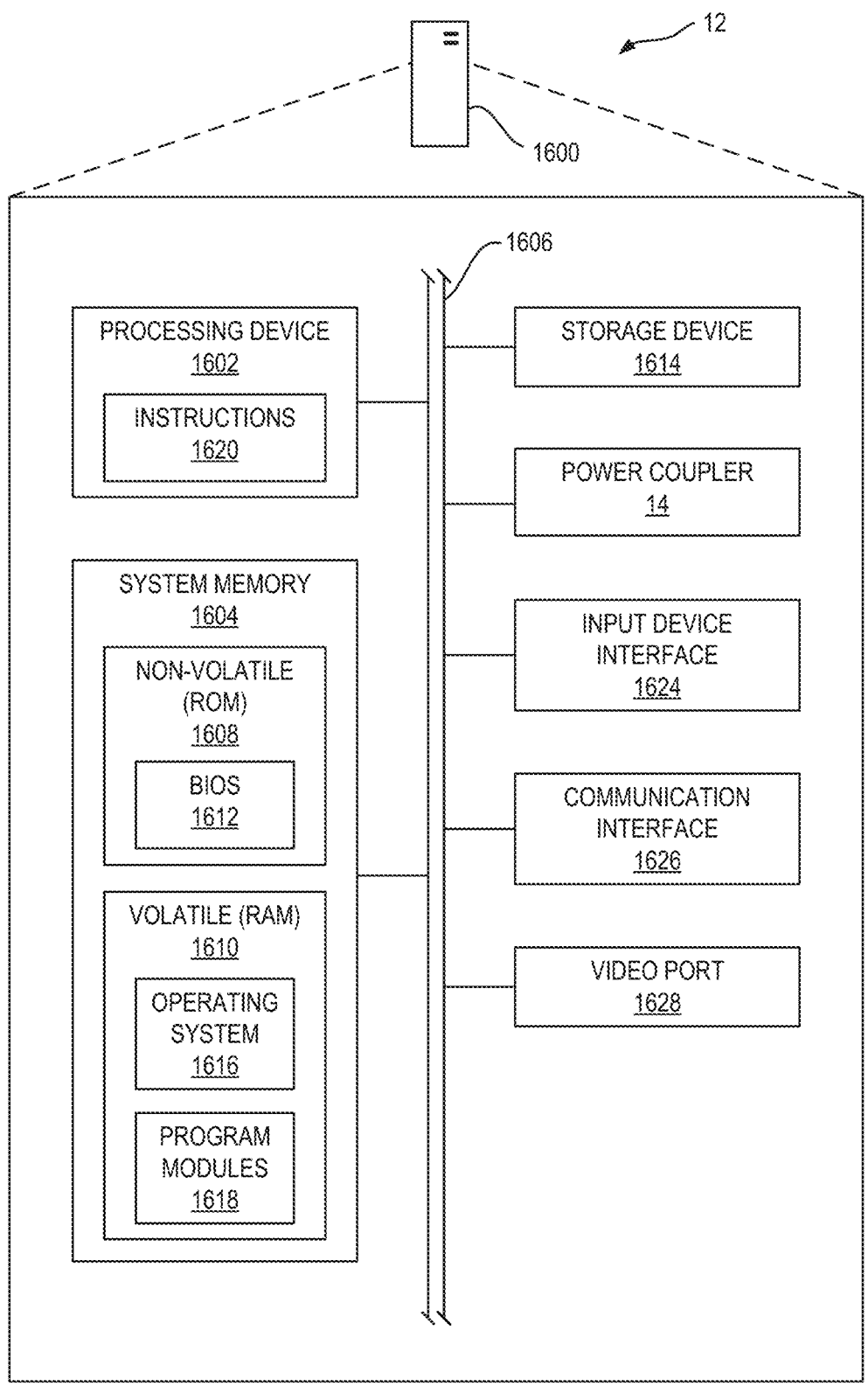
FIG. 16 is a block diagram of a PMU suitable for implementing the HM-ESPRIT according to embodiments disclosed herein.

FIG. 16 is a block diagram of a PMU 10 suitable for implementing the HM-ESPRIT according to embodiments disclosed herein. The PMU 10 includes or is implemented as a computer system 1600, which comprises any computing or electronic device capable of including firmware, hardware, and/or executing software instructions that could be used to perform any of the methods or functions described above, such as synchrophasor estimation for a power distribution system. In this regard, the computer system 1600 may be a circuit or circuits included in an electronic board card, such as a printed circuit board (PCB), a server, a personal computer, a desktop computer, a laptop computer, an array of computers, a personal digital assistant (PDA), a computing pad, a mobile device, or any other device, and may represent, for example, a server or a user's computer.

The exemplary computer system 1600 in this embodiment includes a processing device 1602 or processor, a system memory 1604, and a system bus 1606. The system memory 1604 may include non-volatile memory 1608 and volatile memory 1610. The non-volatile memory 1608 may include read-only memory (ROM), erasable programmable read-only memory (EPROM), electrically erasable programmable read-only memory (EEPROM), and the like. The volatile memory 1610 generally includes random-access memory (RAM) (e.g., dynamic random access memory (DRAM), such as synchronous DRAM (SDRAM)). A basic input/output system (BIOS) 1612 may be stored in the non-volatile memory 1608 and can include the basic routines that help to transfer information between elements within the computer system 1600.

The system bus 1606 provides an interface for system components including, but not limited to, the system memory 1604 and the processing device 1602. The system bus 1606 may be any of several types of bus structures that may further interconnect to a memory bus (with or without a memory controller), a peripheral bus, and/or a local bus using any of a variety of commercially available bus architectures.

The processing device 1602 represents one or more commercially available or proprietary general-purpose processing devices, such as a microprocessor, central processing unit (CPU), or the like. More particularly, the processing device 1602 may be a complex instruction set computing (CISC) microprocessor, a reduced instruction set computing (RISC) microprocessor, a very long instruction word (VLIW) microprocessor, a processor implementing other instruction sets, or other processors implementing a combination of instruction sets. The processing device 1602 is configured to execute processing logic instructions for performing the operations and steps discussed herein.

In this regard, the various illustrative logical blocks, modules, and circuits described in connection with the embodiments disclosed herein may be implemented or performed with the processing device 1602, which may be a microprocessor, field programmable gate array (FPGA), a digital signal processor (DSP), an application-specific integrated circuit (ASIC), or other programmable logic device, a discrete gate or transistor logic, discrete hardware components, or any combination thereof designed to perform the functions described herein. Furthermore, the processing device 1602 may be a microprocessor, or may be any conventional processor, controller, microcontroller, or state machine. The processing device 1602 may also be implemented as a combination of computing devices (e.g., a combination of a DSP and a microprocessor, a plurality of microprocessors, one or more microprocessors in conjunction with a DSP core, or any other such configuration).

The computer system 1600 may further include or be coupled to a non-transitory computer-readable storage medium, such as a storage device 1614, which may represent an internal or external hard disk drive (HDD), flash memory, or the like. The storage device 1614 and other drives associated with computer-readable media and computer-usable media may provide non-volatile storage of data, data structures, computer-executable instructions, and the like. Although the description of computer-readable media above refers to an HDD, it should be appreciated that other types of media that are readable by a computer, such as optical disks, magnetic cassettes, flash memory cards, cartridges, and the like, may also be used in the operating environment, and, further, that any such media may contain computer-executable instructions for performing novel methods of the disclosed embodiments.

An operating system 1616 and any number of program modules 1618 or other applications can be stored in the volatile memory 1610, wherein the program modules 1618 represent a wide array of computer-executable instructions corresponding to programs, applications, functions, and the like that may implement the functionality described herein in whole or in part, such as through instructions 1620 on the processing device 1602. The program modules 1618 may also reside on the storage mechanism provided by the storage device 1614. As such, all or a portion of the functionality described herein may be implemented as a computer program product stored on a transitory or non-transitory computer-usable or computer-readable storage medium, such as the storage device 1614, volatile memory 1610, non-volatile memory 1608, instructions 1620, and the like. The computer program product includes complex programming instructions, such as complex computer-readable program code, to cause the processing device 1602 to carry out the steps necessary to implement the functions described herein.

The computer system 1600 includes or is coupled to a power coupler 14 (e.g., a non-contact field measurement device or a contact voltage probe) for measuring a power signal of a power distribution system to which the PMU 10 is connected. An operator, such as the user, may also be able to enter one or more configuration commands to the computer system 1600 through a keyboard, a pointing device such as a mouse, or a touch-sensitive surface, such as the display device, via an input device interface 1624 or remotely through a web interface, terminal program, or the like via a communication interface 1626. The communication interface 1626 may be wired or wireless and facilitate communications with any number of devices via a communications network in a direct or indirect fashion. An output device, such as a display device, can be coupled to the system bus 1606 and driven by a video port 1628. Additional inputs and outputs to the computer system 1600 may be provided through the system bus 1606 as appropriate to implement embodiments described herein.

The operational steps described in any of the exemplary embodiments herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary embodiments may be combined.

Those skilled in the art will recognize improvements and modifications to the preferred embodiments of the present disclosure. All such improvements and modifications are considered within the scope of the concepts disclosed herein and the claims that follow.

What is claimed is:

1. A method for phasor estimation of a phasor measurement unit (PMU), wherein the PMU comprises at least one voltage sensor or current sensor, the method comprising:
    measuring a signal with the at least one voltage sensor or current sensor;
    receiving the measured signal;
    estimating a size of a signal subspace of the measured signal using a threshold based on a harmonic mean of Eigenvalues associated with a set of Eigenvectors of the measured signal;
    determining frequencies present in the signal subspace based on the size of the signal subspace and the Eigenvalues; and
    using the determined frequencies to produce a phasor estimate for a frequency of interest in the measured signal.

2. The method of claim 1, further comprising decomposing the measured signal into the set of Eigenvectors and the associated Eigenvalues.

3. The method of claim 1, wherein the signal subspace comprises vectors within the set of Eigenvectors of the measured signal corresponding to the Eigenvalues above the harmonic mean.

4. The method of claim 3, wherein a noise subspace comprises vectors within the set of Eigenvectors of the measured signal corresponding to Eigenvalues below the harmonic mean.

5. The method of claim 1, further comprising using the determined frequencies to produce a first phasor estimate for a first frequency of interest and a second phasor estimate for a second frequency of interest.

6. The method of claim 1, wherein the phasor estimate is produced using the determined frequencies present in the signal subspace in conjunction with a least squares algorithm.

7. The method of claim 6, wherein the least squares algorithm is at least one of a total least squares algorithm, a weighted least squares algorithm, a Generalized Taylor Weighted Least Squares (GWTLS) algorithm, and a modified GWTLS algorithm.

8. The method of claim 1, wherein determining the frequencies present in the signal subspace comprises calculating the determined frequencies using an estimation of signal parameters via rotational invariance technique (ESPRIT).

9. The method of claim 1, wherein the measured signal comprises a voltage signal or a current signal from a power distribution system.

10. The method of claim 9, wherein the phasor estimate comprises a synchrophasor estimate for the frequency of interest.

11. The method of claim 10, further comprising providing the synchrophasor estimate from data from the measured signal corresponding to one of the determined frequencies closest to a nominal frequency of the power distribution system.

12. The method of claim 11, further comprising generating a complex wave vector for each of the determined frequencies in the signal subspace.

13. The method of claim 12, further comprising calculating a least squares estimate of a complex phasor for each frequency present in the measured signal.

14. The method of claim 13, wherein the synchrophasor estimate is provided using a phase adjusted complex phasor of the one of the determined frequencies closest to the nominal frequency of the power distribution system.

15. The method of claim 9, further comprising reducing the signal subspace to a reduced signal subspace for signals within a frequency closeness threshold of each other.

16. A phasor measurement unit (PMU), comprising:
    a power coupler;
    at least one voltage sensor or current sensor; and
    a signal processor connected to the power coupler and configured to:
        measure a signal with the at least one voltage sensor or current sensor;
        receive a measured signal from the power coupler;
        estimate a size of a signal subspace of the measured signal using a threshold based on a harmonic mean of Eigenvalues associated with a set of Eigenvectors of the measured signal;
        determine vectors in the signal subspace based on the size of the signal subspace and the Eigenvalues corresponding to the vectors; and
        produce a synchrophasor estimate for a frequency of interest in the measured signal.

17. The PMU of claim 16, wherein the frequency of interest comprises one or more of a nominal frequency of a power distribution system coupled to the PMU or a harmonic of the nominal frequency.

18. The PMU of claim 16, wherein the threshold is the harmonic mean of the Eigenvalues associated with the set of Eigenvectors of the measured signal.

\* \* \* \* \*